US010784436B2

(12) United States Patent
Itayama

(10) Patent No.: US 10,784,436 B2
(45) Date of Patent: Sep. 22, 2020

(54) PIEZOELECTRIC SENSOR AND PIEZOELECTRIC DEVICE

(71) Applicant: SEIKO EPSON CORPORATION, Tokyo (JP)

(72) Inventor: Yasuhiro Itayama, Chino (JP)

(73) Assignee: Seiko Epson Corporation, Tokyo (JP)

( * ) Notice: Subject to any disclaimer, the term of this patent is extended or adjusted under 35 U.S.C. 154(b) by 454 days.

(21) Appl. No.: 15/888,931

(22) Filed: Feb. 5, 2018

(65) Prior Publication Data

US 2018/0226564 A1 Aug. 9, 2018

(30) Foreign Application Priority Data

Feb. 7, 2017 (JP) ................................ 2017-020711

(51) Int. Cl.
| | |
|---|---|
| H01L 41/09 | (2006.01) |
| H01L 41/107 | (2006.01) |
| H01L 41/113 | (2006.01) |
| B06B 1/06 | (2006.01) |
| H01L 41/27 | (2013.01) |
| H01L 41/053 | (2006.01) |
| H01L 41/047 | (2006.01) |
| G01H 7/00 | (2006.01) |
| G01L 9/00 | (2006.01) |

(52) U.S. Cl.
CPC ............ H01L 41/1132 (2013.01); B06B 1/06 (2013.01); B06B 1/0629 (2013.01); G01H 7/00 (2013.01); G01L 9/0022 (2013.01); H01L 41/047 (2013.01); H01L 41/053 (2013.01); H01L 41/27 (2013.01)

(58) Field of Classification Search
CPC . H01L 41/1132; H01L 41/047; H01L 41/053; H01L 41/27; B06B 1/06; B06B 1/0629; G01H 7/00; G01L 9/0022
USPC .................................................. 310/334, 338
See application file for complete search history.

(56) References Cited

U.S. PATENT DOCUMENTS

| | | | | |
|---|---|---|---|---|
| 3,243,768 | A | * 3/1966 | Roshon, Jr. ............ | B06B 1/0607 367/151 |
| 6,159,749 | A | * 12/2000 | Liu ........................ | B01L 3/502 250/251 |
| 2006/0196272 | A1 | 9/2006 | Sugiura et al. | |

(Continued)

FOREIGN PATENT DOCUMENTS

| | | |
|---|---|---|
| JP | 11-105281 | 4/1999 |
| JP | 2006-242650 | 9/2006 |

(Continued)

*Primary Examiner* — Thomas M Dougherty
(74) *Attorney, Agent, or Firm* — Workman Nydegger

(57) ABSTRACT

A transmitting piezoelectric element and receiving piezoelectric elements and are arranged on a vibrating plate opposed to each opening of openings of a piezoelectric sensor, and, when an external force is applied in a vertical direction with respect to the vibrating plate opposed to the openings, a region which has a maximum principal stress which is a maximum value of the stress of the vibrating plate is a first region, and a region which has a minimum principal stress which is a minimum value of the stress of the vibrating plate is a second region, the receiving piezoelectric elements and are arranged in the first region and the transmitting piezoelectric element is arranged in the second region.

12 Claims, 14 Drawing Sheets

(56) References Cited

U.S. PATENT DOCUMENTS

2010/0251823 A1* 10/2010 Adachi .................... A61B 8/12
  73/606
2013/0258814 A1* 10/2013 Rich .................... B06B 1/0633
  367/157
2017/0324162 A1* 11/2017 Khachaturian ...... H01Q 21/065

FOREIGN PATENT DOCUMENTS

| JP | 2009-284021 A | 12/2009 |
| JP | 2011-82624 A | 4/2011 |

* cited by examiner

PIEZOELECTRIC SENSOR AND PIEZOELECTRIC DEVICE

This application claims priority under 35 U.S.C. § 119 to Japanese Patent Application No. 2017-020711 filed on Feb. 7, 2017, the entire disclosure of which is expressly incorporated by reference herein.

BACKGROUND

1. Technical Field

The present invention relates to a piezoelectric sensor and a piezoelectric device.

2. Related Art

In the related art, there is known a piezoelectric sensor which is provided with a vibrating plate which closes an opening, a transmitting piezoelectric element for transmission, and a receiving piezoelectric element for reception, on a substrate having an opening that is opened in a thickness direction.

For example, Japanese Patent No. 4715236 discloses an ultrasonic sensor apparatus which is provided with an ultrasonic transmission element and a plurality of reception elements, in which ultrasonic waves are transmitted from the transmission element and the ultrasonic waves reflected by a detection object are received by the plurality of reception elements to carry out a calculation process.

JP-A-2011-82624 discloses a proximity ultrasonic sensor which is provided with an ultrasonic transducer for transmission and an ultrasonic transducer for reception, each having a silicon (Si) substrate and a plurality of laminates provided on the Si substrate. The laminate of the proximity ultrasonic sensor is formed of a support layer provided on the Si substrate, a first electrode provided on the support layer, a piezoelectric layer provided on the first electrode, and a second electrode provided on the piezoelectric layer. In such a proximity ultrasonic sensor, the ultrasonic transducer for transmission and the ultrasonic transducer for reception are integrally arranged adjacent to each other and formed so as to suppress sound seeping in and reverberation vibrations.

JP-A-2009-284021 discloses a piezoelectric thin film resonator formed of a circular piezoelectric thin film, circular electrodes formed on the upper surface and lower surface of the piezoelectric thin film and in the vicinity of the center, and a plurality of annular electrodes formed on the upper surface and lower surface of the piezoelectric thin film and concentrically centered around the circular electrodes. In this piezoelectric thin film resonator, the circular electrode and the plurality of annular electrodes are each formed such that the electrode width becomes narrower in the end face direction of the circular plate, and the resonance frequency of the piezoelectric thin film resonator is determined by the diameter of the circular plate and the arrangement of various electrodes (degree of vibration mode). Therefore, even in the resonators with different resonance frequencies, it is possible to manufacture resonators by the same process simply by changing the arrangement of the various electrodes by changing the mask pattern.

However, in the ultrasonic sensor apparatus of Japanese Patent No. 4715236, since the transmission element and the plurality of receiving elements are separately formed, the area of these elements increases and the degree of integration decreases. In addition, in the proximity ultrasonic sensor in JP-A-2011-82624, since the ultrasonic transducer for transmission and the ultrasonic transducer for reception are integrally arranged adjacent to each other in a direction which suppresses the reverberation vibrations, there is a problem in that the degree of integration decreases. Furthermore, in the piezoelectric thin film resonator of JP-A-2009-284021, since elements specialized for transmission and reception are not used and various signals are transmitted and received within the same element, in a case where another circuit such as, for example, a feedback circuit is provided separately, there is a problem in that the degree of integration decreases. Here, such a problem similarly exists in all piezoelectric devices on which a piezoelectric sensor is mounted.

SUMMARY

An advantage of some aspects of the invention is to provide a piezoelectric sensor and a piezoelectric device capable of increasing the degree of integration of a transmitting piezoelectric element and a receiving piezoelectric element.

According to an aspect of the invention, there is provided a piezoelectric sensor including a substrate having openings which are open in a thickness direction, a vibrating plate which blocks the opening, a transmitting piezoelectric element for transmission, and a receiving piezoelectric element for reception, in which the transmitting piezoelectric element and the receiving piezoelectric element are arranged on the vibrating plate opposed to each one of the openings, and, when an external force is applied in a vertical direction with respect to the vibrating plate opposed to the opening, a region which has a maximum principal stress which is a maximum value of the stress of the vibrating plate is a first region, and a region which has a minimum principal stress which is a minimum value of the stress of the vibrating plate is a second region, the receiving piezoelectric element is arranged in the first region and the transmitting piezoelectric element is arranged in the second region.

According to this aspect, it is possible to increase the degree of integration of the transmitting piezoelectric element and the receiving piezoelectric element.

Here, in the piezoelectric sensor described above, it is preferable that the first region be a region opposed to a peripheral edge of the vibrating plate opposed to the opening, and the second region be a center portion of the vibrating plate opposed to the opening. According to this, it is possible to further increase the degree of integration of the transmitting piezoelectric element and the receiving piezoelectric element.

In addition, in the piezoelectric sensor described above, it is preferable that the receiving piezoelectric element be formed of a first receiving piezoelectric element and a second receiving piezoelectric element, the first receiving piezoelectric element and the second receiving piezoelectric element are each arranged in a region opposed in a first direction or a second direction to the peripheral edge of the vibrating plate opposed to the opening, the transmitting piezoelectric element is arranged between the first receiving piezoelectric element and the second receiving piezoelectric element so as to be spaced apart and not in contact with each other. According to this, it is possible to further increase the degree of integration of the transmitting piezoelectric element and the receiving piezoelectric element.

In addition, in the piezoelectric sensor described above, it is preferable that an area occupied by the transmitting piezoelectric element on the vibrating plate opposed to the one opening be larger than an area occupied by the receiving piezoelectric element. According to this, it is possible to increase the transmission sensitivity of the transmitting piezoelectric element and to improve various characteristics of the piezoelectric sensor.

In addition, in the piezoelectric sensor described above, a material of a first piezoelectric layer forming the transmitting piezoelectric element and a material of a second piezoelectric layer forming the receiving piezoelectric element may be different from each other. According to this, it is possible to increase the transmission and reception sensitivity of the transmitting piezoelectric element and the receiving piezoelectric element and to improve various characteristics of the piezoelectric sensor.

In addition, in the piezoelectric sensor described above, a thickness of the first piezoelectric layer forming the transmitting piezoelectric element may be thinner than a thickness of the second piezoelectric layer forming the receiving piezoelectric element. According to this, it is possible to increase the transmission sensitivity of the transmitting piezoelectric element and to improve various characteristics of the piezoelectric sensor.

According to another aspect of the invention, there is provided a piezoelectric device including the piezoelectric sensor described above.

According to this aspect, it is possible to provide a piezoelectric device provided with a piezoelectric sensor capable of increasing the degree of integration of the transmitting piezoelectric element and the receiving piezoelectric element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
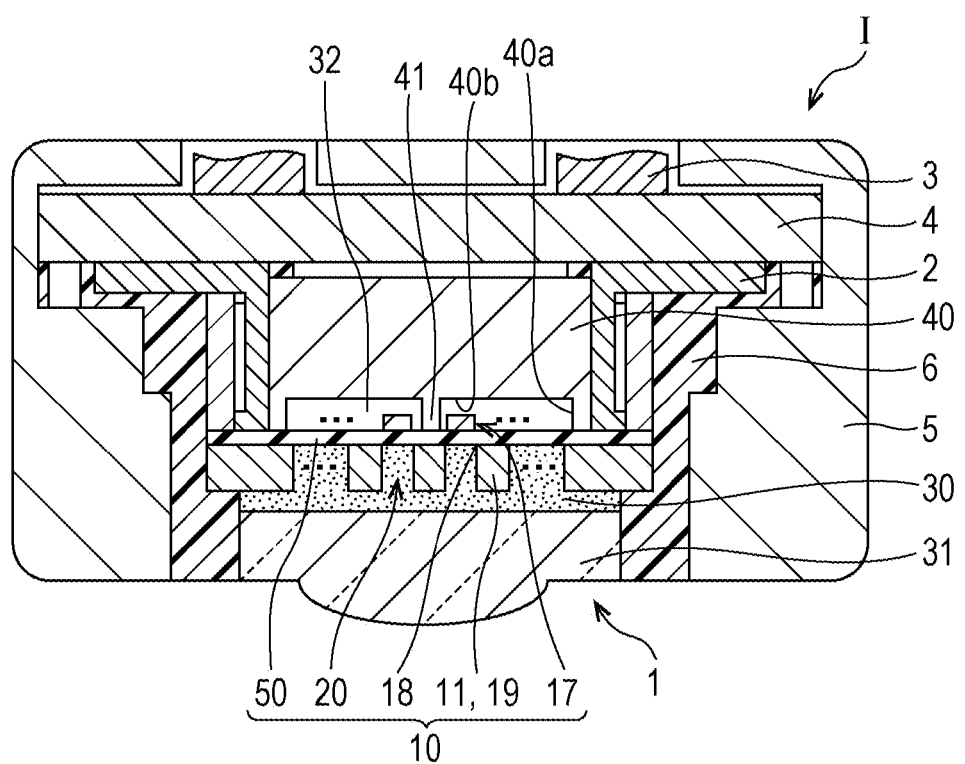
FIG. 1 is a cross-sectional view showing a configuration example of an ultrasonic probe according to a first embodiment.

A description will be given below of embodiments of the invention with reference to the drawings. The following description shows one embodiment of the invention, and is able to be arbitrarily changed within a range not deviating from the gist of the invention. Here, in each of the drawings, the same reference numerals being attached denotes that the members are the same and explanation thereof is appropriately omitted. In addition, X, Y, and Z represent three spatial axes orthogonal to each other. In the present specification, a description will be given with directions along these axes taken as a first direction X (X direction), a second direction Y (Y direction), and a third direction Z (Z direction), respectively, and the direction in which the arrows are pointing in each diagram being the positive (+) direction, and the opposite direction to the arrow being the negative (−) direction. The X direction and the Y direction represent in-plane directions of the plate, layer, and film, and the Z direction represents the thickness direction or lamination direction of the plate, layer, and film.

In addition, the constituent elements shown in each drawing, that is, the shape and size of each section, the thicknesses of plates, layers, and films, the relative positional relationships, the repeating units, and the like may be exaggeratedly shown in order to illustrate the invention. Furthermore, the term "above" in this specification is not intended to limit the positional relationship of constituent elements to being "directly on". For example, the expression "each kind of first electrode on the substrate" or "each kind of piezoelectric layer on each kind of first electrode" does not exclude other constituent elements from being included between the substrate and each kind of first electrode or between each kind of first electrode and each kind of piezoelectric layer.

First Embodiment

Ultrasonic Probe

In the first embodiment, an ultrasonic probe is taken as an example of an ultrasonic device which is a piezoelectric device, and description will be given thereof with reference to the drawings. FIG. 1 is a cross-sectional view showing a configuration example of an ultrasonic probe according to the first embodiment. As shown in the diagram, an ultrasonic probe (probe) I is formed to be provided with an ultrasonic sensor 1 of a type (CAV surface type) in which the side opposite to the piezoelectric element 17 of the vibrating plate 50 is an ultrasonic wave passage region, a flexible printed circuit board (FPC board) 2 connected to the ultrasonic sensor 1, a cable 3 drawn out from an apparatus terminal (not shown), a relay board 4 for relaying the FPC board 2 and the cable 3, a housing 5 for protecting the ultrasonic sensor 1, the FPC board 2, and the relay board (FPC board) 4, and a waterproof resin 6 filled between the housing 5 and the ultrasonic sensor 1. In addition, the ultrasonic sensor 1 is formed to include an acoustic matching layer 30 for propagating ultrasonic waves generated by driving the piezoelectric element 17, a lens member 31 which is a refracting member for refracting the ultrasonic waves, and an enveloping plate 40. Here, the probe I is not limited to the above configuration, and may be formed to include other elements as necessary.

The ultrasonic sensor 1 mounted on the probe I is formed as an integrated transmission and reception type sensor, and transmitted ultrasonic waves are transmitted through the acoustic matching layer 30 and the lens member 31 according to the repeated transmission period of the ultrasonic sensor 1. As the transmitted ultrasonic waves are transmitted at predetermined intervals, reflected ultrasonic waves reflected from the object to be measured are received through the acoustic matching layer 30 and the lens member 31. Based on the waveform signals of these transmitted ultrasonic waves and reflected ultrasonic waves, information (the position, shape, and the like) relating to the object to be measured is detected in the apparatus terminal of the probe I. According to such an ultrasonic sensor 1, it is possible to suppress variations in transmission and reception sensitivity and to improve the reception sensitivity. Accordingly, mounting the ultrasonic sensor 1 on the probe I obtains a probe I having excellent detection sensitivity.

In addition, compared to an ultrasonic sensor of a type (ACT surface type) in which the piezoelectric element 17 side of the vibrating plate 50 is the ultrasonic wave passage region, the CAV surface type ultrasonic sensor 1 has the piezoelectric element 17 which forms the ultrasonic element 10 positioned further away from the object to be measured. Accordingly, it is very difficult for moisture from outside to reach the piezoelectric element 17, and the ultrasonic sensor 1 is excellent in electrical safety during use. Moreover, in a case where the piezoelectric element 17 is a thin film, it is possible to improve the handling property at the time of manufacturing, thus the handling of the ultrasonic sensor 1 is easy. However, the ultrasonic sensor 1 is not limited to the CAV surface type, and application is also possible to an ACT surface type.

Ultrasonic Sensor

Figure 2:
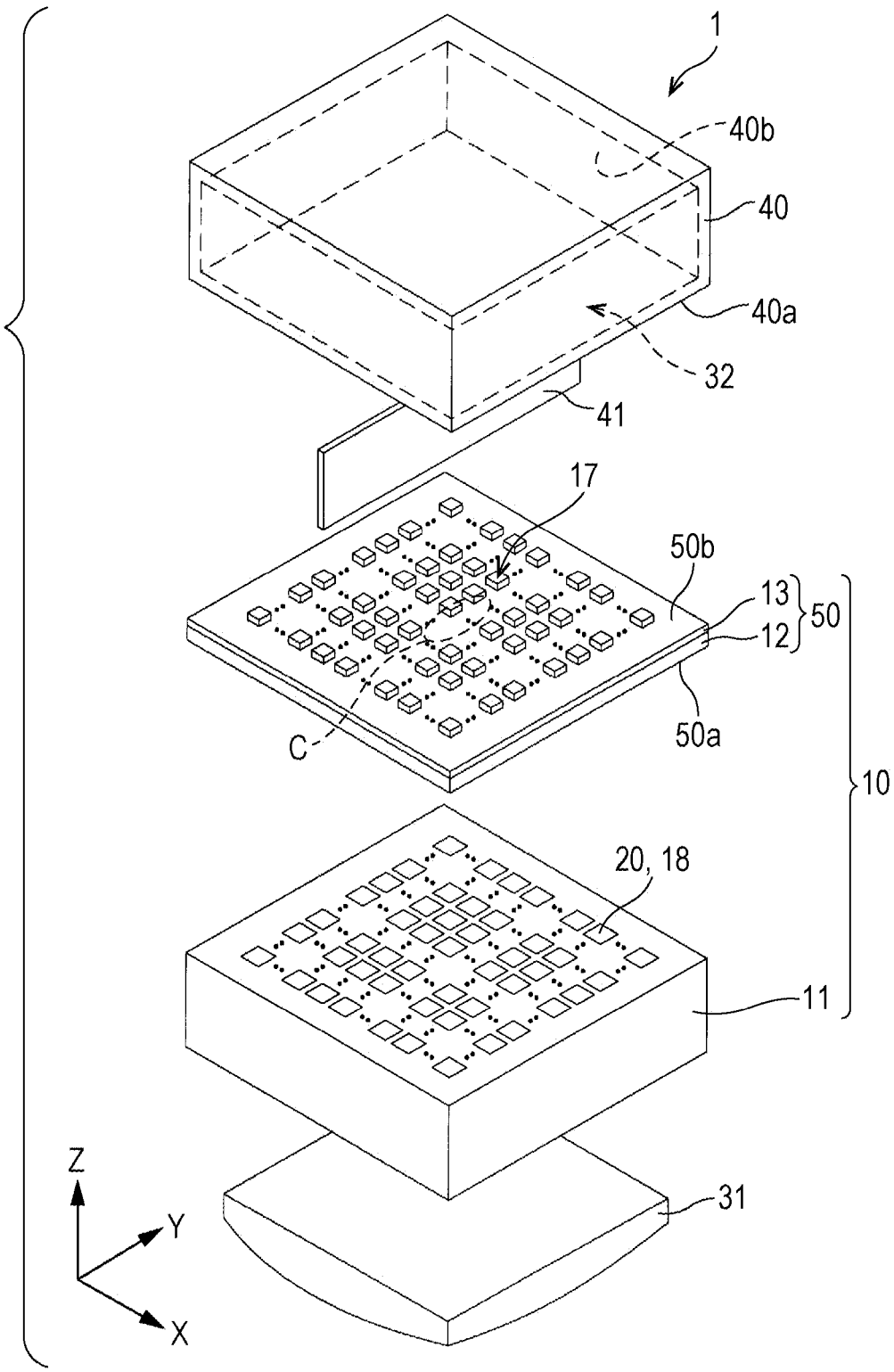
FIG. 2 is an exploded perspective view showing a configuration example of an ultrasonic sensor according to a first embodiment.

Next, the ultrasonic sensor 1 mounted on the probe I is taken as an example of a piezoelectric sensor, and description will be given thereof with reference to the drawings. FIG. 2 is an exploded perspective view showing a configuration example of the ultrasonic sensor according to the first embodiment. As shown in FIG. 1 and FIG. 2, the ultrasonic sensor 1 is formed to include an ultrasonic element 10, an acoustic matching layer 30, a lens member 31, and the enveloping plate 40. In FIG. 2, the enveloping plate 40 and the support member 41 are shown as separate bodies, but in practice, as shown in FIG. 1, both are formed integrally. Here, the ultrasonic sensor 1 is not limited to the above-described configuration, and may be formed to include other elements.

Since the ultrasonic sensor 1 is formed as a CAV surface type, the acoustic matching layer 30 is provided in the space 20. A material having acoustic matching capability is filled in the space 20 and the like of the substrate 11 to form the acoustic matching layer 30, making it possible to prevent the acoustic impedance from abruptly changing between the ultrasonic element 10 and the object to be measured, and, as a result, it is possible to prevent a reduction in the propagation efficiency of the ultrasonic waves. Examples of such a material having such an acoustic matching capability include materials (fluid materials) having fluidity such as silicone-based materials such as silicone oil, silicone resin, or silicone rubber. However, the material having an acoustic matching capability is not limited to the above example, and it is possible to appropriately select and use a material depending on the use of the ultrasonic sensor 1 or the like.

The lens member 31 is provided on the opposite side of the vibrating plate 50 on the substrate 11. The lens member 31 has a role of converging ultrasonic waves. In a case where ultrasonic waves are converged by the electron focusing method or the like, it is possible to omit the lens member 31. In addition, it is also possible to replace the lens member 31 with a protective plate or the like which does not have an ultrasonic wave convergence function.

Since the acoustic matching layer 30 has a bonding function or adhesion function between the lens member 31 and the substrate 11 in addition to the acoustic matching capability, it is possible to form the ultrasonic sensor 1 by interposing the acoustic matching layer 30 between the lens member 31 and the substrate 11. It is possible to form the lens member 31 of the same material as the material having the acoustic matching capability described above. Using the same material as the acoustic matching layer 30 makes it possible to easily bond or adhere the acoustic matching layer 30 and the lens member 31. However, the material applicable to the lens member 31 is not limited to the above example, and it is possible to appropriately select and use a material according to the use or the like of the ultrasonic sensor 1.

The enveloping plate 40 is provided on the insulating film 13 side of the vibrating plate 50. The enveloping plate 40 is adhered or bonded to the vibrating plate 50 via an edge 40a and the support member 41. It is possible to use an adhesive or the like for the adhesion or bonding of the enveloping plate 40, without being limited to the above example. The thickness of the enveloping plate 40 is 400 µm, but the thickness is not limited to the above value.

A recessed portion (piezoelectric element holding portion 32) is formed in the center of the enveloping plate 40, and the periphery of the piezoelectric element holding portion 32 is surrounded by the edge 40a and the surface 40b of the enveloping plate 40. A region (a region including the upper surface and the side surface of the ultrasonic element 10) at the periphery of the ultrasonic element 10 is covered by the piezoelectric element holding portion 32. Accordingly, the upper surface of the ultrasonic element 10 is covered with the surface 40b of the enveloping plate 40, and the side surface is covered with the edge 40a.

The length of the piezoelectric element holding portion 32 in the Z direction is 80 μm, but the length is not limited to the above value. The length of the piezoelectric element holding portion 32 in the Z direction may be any value as long as a space is secured to the extent that the driving of the ultrasonic element 10 is not hindered. In addition, the piezoelectric element holding portion 32 may be filled with the atmosphere or air (dry air), or may be filled with resin. Alternatively, the piezoelectric element holding portion 32 may be filled with a sealed gas such as nitrogen ($N_2$) or argon (Ar), and it is possible to arbitrarily select the type and pressure of the sealed gas.

In the ultrasonic sensor 1, a support member 41 is provided between the surface 40b of the enveloping plate 40 and the second surface 50b of the vibrating plate 50 and at a position not overlapping the ultrasonic element 10, and the vibrating plate 50 is supported by this support member 41. Therefore, for example, when mounting the lens member 31 on the ultrasonic element 10 or when securing the adhesion between the ultrasonic element 10 and the lens member 31, the lens member 31 may be pressed to the acoustic matching layer 30 side. Even in a case where the lens member 31 is not provided or a case where another member is provided in place of the lens member 31, in order to secure the adhesiveness of each member, a pressing force may also be applied to the vibrating plate 50 from the acoustic matching layer 30 side. Since the ultrasonic sensor 1 is formed to be provided with the support member 41, even if a predetermined external pressure is applied to the vibrating plate 50, it is possible to suppress the occurrence of structural distortion and to secure high reliability.

In addition, since the support member 41 is provided at a position not overlapped with the ultrasonic element 10, for example, between the ultrasonic elements 10, excessive restraint of the piezoelectric elements 17 by the support members 41 is avoided. Thus, compared to a case where the support member 41 is not provided, the ultrasonic transmission efficiency and the reception efficiency are also prevented from being excessively lowered. The support member 41 is adhered or bonded to the ultrasonic element 10 side with an adhesive or the like, but this method is not limited to the previous example.

The support member 41 has a beam shape extending in the Y direction. According to this, it is possible to support the vibrating plate 50 over a wide range in the Y direction. The beam-shaped support member 41 may extend in the X direction rather than in the Y direction. The beam-shaped support member 41 may have one extending end portion separated from the edge 40a of the enveloping plate 40. The beam-shaped support member 41 of the invention includes any support member as long as at least one end portion in the extending direction is in contact with the edge 40a of the enveloping plate 40.

The support member 41 may not have a beam shape. The support member 41 may not be linear in the extending direction. Although the cross-sectional area of the support member 41 in the XY plane varies depending on the Z direction in some cases depending on the method for manufacturing the support member 41, such support members are included in the support member 41 of the present embodiment as long as it is possible to support the vibrating plate 50.

The center portion of the piezoelectric element holding portion 32 is comparatively distant from the edge 40a of the enveloping plate 40. Accordingly, in a case where the support member 41 is not provided in the vibrating plate 50, the rigidity tends to be low at a center portion C corresponding to the center portion of the piezoelectric element holding portion 32. Therefore, the support member 41 is provided at the center portion of the piezoelectric element holding portion 32 so as to support the center portion C of the vibrating plate 50. As a result, it is possible to secure higher reliability.

In the ultrasonic sensor 1, it is possible to variously select the number, arrangement, shape, and the like of the support member 41. For example, a plurality of support members 41 may be used. In such a case, it is preferable that the support members 41 be provided at equal intervals in the piezoelectric element holding portion 32. According to this, it is possible to support the vibrating plate 50 all over. Accordingly, the number of the vibrating plates 50 is preferably an odd number of three or more. This is because when the support members 41 are provided at equal intervals in the piezoelectric element holding portion 32, it is possible to position the middle support member 41 in the vicinity of the center portion C of the vibrating plate 50. For example, when the number of support members 41 is approximately three, the balance is good. The support member 41 may be provided only in a portion shifted from the center portion C of the vibrating plate 50.

The beam-shaped support member 41 is manufactured by wet etching the enveloping plate 40. In this manner, the support member 41 is manufactured by making use of the constituent material of the enveloping plate 40, and has the same configuration as the enveloping plate 40. Although wet etching is inferior in processing accuracy to, for example, dry etching, since it is possible to cut many regions in a short time, wet etching is a preferable technique for manufacturing the beam-shaped support member 41.

Normally, in the ultrasonic sensor, the ultrasonic elements are lined up two-dimensionally in the X direction and in the Y direction orthogonal to the X direction, and the X direction is the scanning direction, and the Y direction is the slice direction. In the configuration example of the present embodiment, sixteen ultrasonic elements 10 are lined up in the Y direction, which is the slice direction, and 64 ultrasonic elements 10 are lined up in the X direction, which is the scanning direction, and FIG. 2 shows only a part thereof. In the ultrasonic sensor 1, while scanning in the scanning direction (X direction), driving, that is, the transmission and reception of ultrasonic waves, is performed for each column extending in the slice direction (Y direction), making it possible to continuously acquire sensing information in the slice direction, in the scanning direction.

Although the ultrasonic element 10 of the present embodiment is formed to include the substrate 11, the vibrating plate 50, and the piezoelectric element 17; however, the ultrasonic element 10 may be formed to include other elements. The substrate 11 is formed of, for example, a silicon (Si) single crystal substrate. Here, the material of the substrate 11 is not limited to Si, and may be silicon on insulator (SOI), glass, or the like. However, the material of the substrate 11 is not limited to the above example, and it is possible to appropriately select and use a material according to the use or the like of the ultrasonic sensor 1.

A plurality of partitions 19 are formed on the substrate 11. A plurality of cavities (CAVs) (spaces 20) are defined in the X direction and the Y direction by the plurality of partitions 19. The space 20 is formed to penetrate the substrate 11 in the thickness direction (Z direction). That is, an opening 18 which opens to the vibrating plate 50 side is formed in the substrate 11. A plurality of openings 18 are formed two-dimensionally, that is, as a plurality in the X direction and as a plurality in the Y direction. It is possible to variously modify the arrangement and shape of the opening 18. For example, a plurality of openings 18 may be formed one-dimensionally, that is, in one of the X direction and the Y direction. In addition, when the substrate 11 is viewed from the vertical direction (Z direction), the opening 18 may be formed in a square shape (the ratio of the length in the X direction and the length in the Y direction is 1:1), or may be formed in a rectangular shape (the ratio of the length in the X direction and the length in the Y direction is other than 1:1) (refer to FIG. 3). Alternatively, the opening 18 may be formed in another shape, for example, a circular shape (refer to FIG. 7) or the like as necessary.

The vibrating plate 50 is provided on the substrate 11 so as to close the opening 18 and is formed by an elastic film 12 formed on the substrate 11 and an insulating film 13 formed on the elastic film 12. Below, the surface of the vibrating plate 50 on the substrate 11 side is referred to as a first surface 50a, and the surface opposed to the first surface 50a is referred to as a second surface 50b. In such a case, in the vibrating plate 50, the first surface 50a is formed of the elastic film 12 and the second surface 50b is formed of the insulating film 13.

In the present embodiment, the vibrating plate 50 is formed of the elastic film 12 formed of an elastic material such as silicon dioxide ($SiO_2$) and the insulating film 13 formed of an insulating material such as zirconium oxide ($ZrO_2$), but the vibrating plate 50 is not limited to this configuration. For example, the vibrating plate 50 may be formed of either one of the elastic film 12 and the insulating film 13, or may be formed of another film. In addition, the elastic film 12 may not be a separate member from the substrate 11. A part of the substrate 11 may be thinned and used as the elastic film 12.

Here, a portion of the vibrating plate 50 on the second surface 50b side, which corresponds to the space 20, is referred to as a movable portion. The movable portion is a portion where vibration is generated by the displacement of the piezoelectric element 17. For example, when a voltage is applied to the piezoelectric element 17, vibration occurs in the movable portion. Due to this vibration, pressure fluctuations occur in the acoustic matching layer 30 which is a medium in the space 20 and transmission ultrasonic waves are transmitted from the ultrasonic sensor 1 according to the pressure fluctuations, or reflected ultrasonic waves reflected from the object to be measured (received ultrasonic waves) are received.

Figure 3:
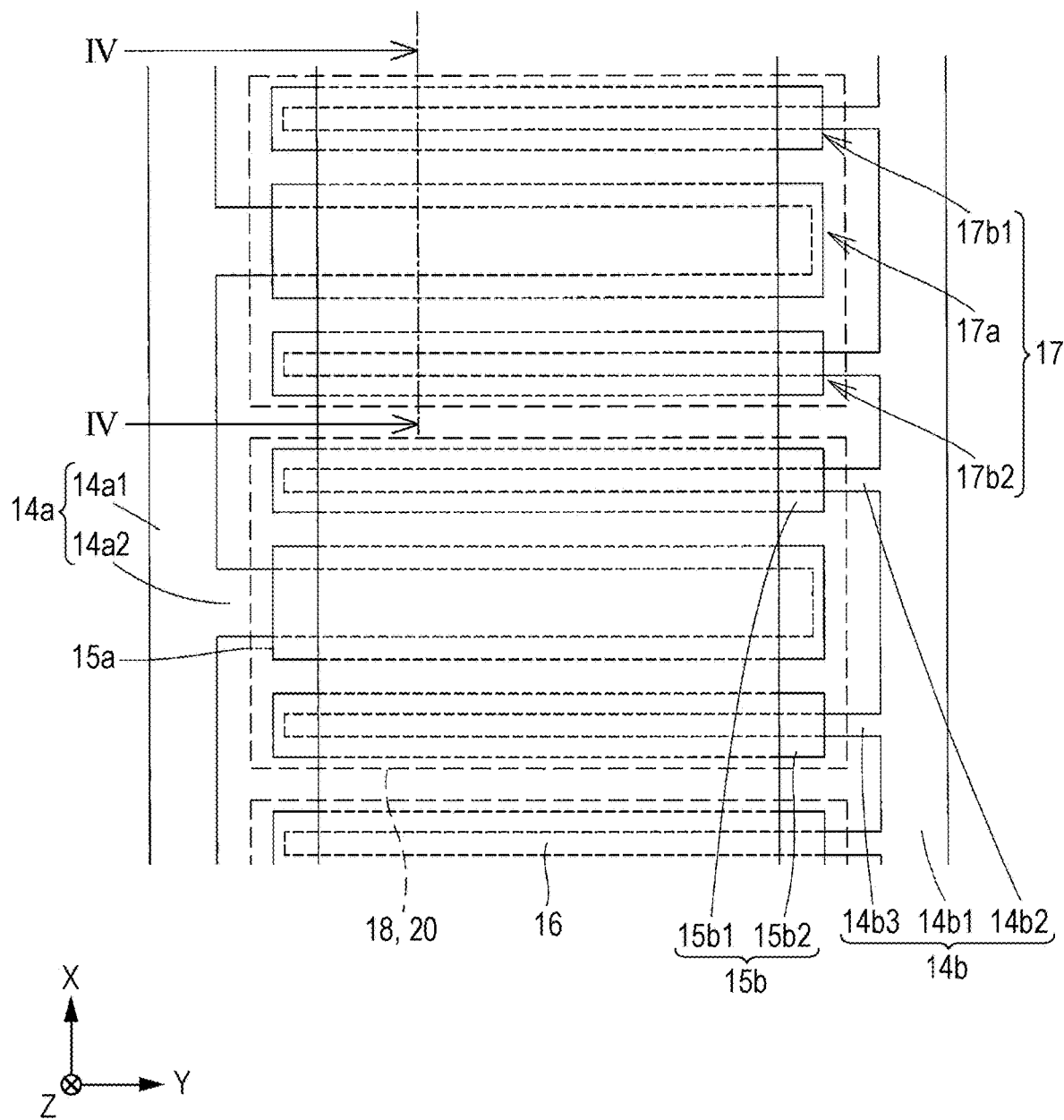
FIG. 3 is a plan view showing a configuration example of a piezoelectric element according to a first embodiment.
Figure 4:
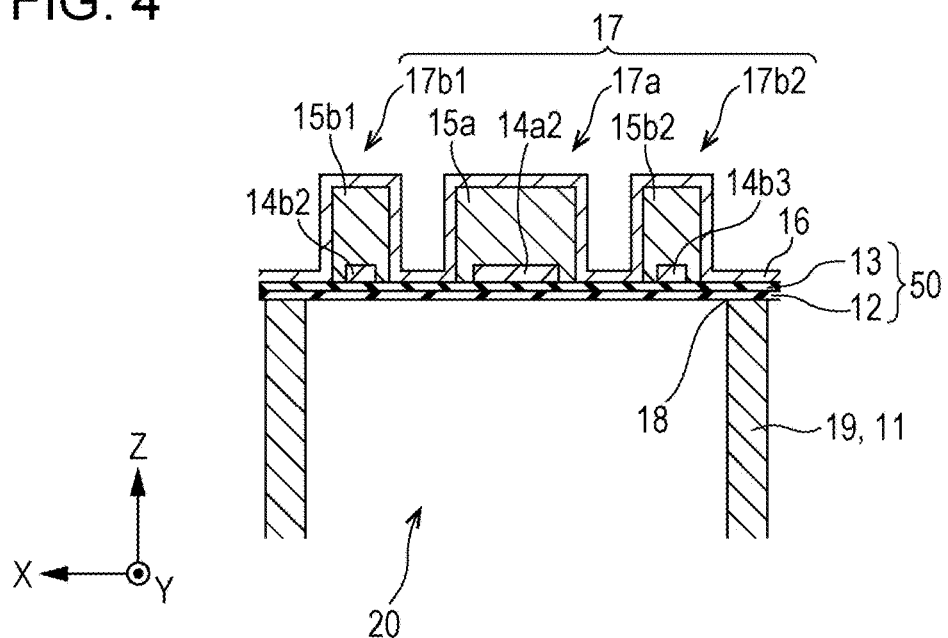
FIG. 4 is a cross-sectional view taken along line IV-IV of FIG. 3.

FIG. 3 is a plan view showing a configuration example of the piezoelectric element of the first embodiment, and FIG. 4 is a cross-sectional view taken along line IV-IV of FIG. 3. These diagrams show an example in which, when the piezoelectric element 17 on the vibrating plate 50 is viewed from the vertical direction (Z direction), the opening 18 is formed in a rectangular shape (the ratio of the lengths in the X direction and the Y direction is 1:2). In addition, in FIG. 5 and FIG. 6 described below, the openings 18 formed in the same shape are used.

As shown in the diagrams, the piezoelectric element 17 is provided at a position (a position opposed to the opening 18) opposed to the opening 18 (space 20) on the vibrating plate 50 formed of the elastic film 12 and the insulating film 13, and arranged in a region corresponding to the opening 18 on the vibrating plate 50 (in the region corresponding to the opening 18). That is, the opening 18 is formed in the region corresponding to the piezoelectric element 17 on the vibrating plate 50, and the opening 18 is partitioned by the partition 19.

Although not shown, other layers may be provided between the piezoelectric element 17 and the vibrating plate 50. Examples of the other layers include an adhesion layer for improving the adhesion between the piezoelectric element 17 and the vibrating plate 50, or the like. It is possible to form such an adhesion layer of, for example, titanium oxide (TiOX), titanium (Ti), silicon nitride (SiN), or the like.

The piezoelectric element 17 of the present embodiment is formed of one transmitting piezoelectric element 17a and two receiving piezoelectric elements 17b1 and 17b2 and these are provided at positions opposed to one opening 18 and arranged in a region corresponding to one opening 18. When viewed from the vertical direction (Z direction), the receiving piezoelectric elements 17b1 and 17b2 are respectively arranged at both end sides in the lateral direction (X direction) in the region corresponding to the opening 18. In addition, the transmitting piezoelectric element 17a is arranged between the receiving piezoelectric elements 17b1 and 17b2 so as to be spaced apart and not in contact with each other.

That is, the widths in the lateral direction (X direction) and the longitudinal direction (Y direction) of each piezoelectric element 17a, 17b1, and 17b2 are all shorter than the widths in the lateral direction (X direction) and the longitudinal direction (Y direction) of the opening 18. However, the invention also includes cases where the width in the lateral direction (X direction) or the longitudinal direction (Y direction) of the transmitting piezoelectric element 17a or the receiving piezoelectric elements 17b1 and 17b2 is longer than the width of the opening 18 in the lateral direction (X direction) or the longitudinal direction (Y direction).

Here, regarding the deformation of the vibrating plate when a general piezoelectric sensor receives a force, there is both extension and contraction deformation (elongation deformation and compressive deformation) when viewed locally. In a case where an external force is applied to the piezoelectric element of the piezoelectric sensor in the vertical direction, a first region having the maximum principal stress $\sigma_1$, which is the maximum value of the stress, and a second region having the minimum principal stress $\sigma_2$, which is the minimum value, are present in the piezoelectric element. Here, in such a case, the maximum principal stress is elongation stress ($\sigma_1 > 0$) and the minimum principal stress is compressive stress ($\sigma_2 < 0$).

For example, in the case where the piezoelectric sensor is an ultrasonic sensor, even in a region corresponding to one opening, there is a region where it is easy to transmit ultrasonic waves generated by vibration and a region where it is easy to receive the reflected ultrasonic waves reflected from the object to be measured. Accordingly, the receiving piezoelectric element is arranged in a region where the elongation deformation is the maximum (the maximum principal stress $\sigma_1$) and it is easy to receive the reflected ultrasonic waves, and the transmitting piezoelectric element is arranged in a region where the compressive deformation is the maximum (the minimum principal stress $\sigma_2$) and it is easy to transmit the ultrasonic waves, thus it is possible to achieve high integration in the ultrasonic sensor and realize miniaturization of the ultrasonic sensor while improving the transmission and reception capability of the receiving piezoelectric element and the transmitting piezoelectric element.

In the piezoelectric element 17 of the ultrasonic sensor 1 of the present embodiment, each of the receiving piezoelectric elements 17b1 and 17b2 are arranged in an elongation deformation region (the first region having the maximum principal stress $\sigma_1$) of the vibrating plate 50 in the region corresponding to the opening 18, for example, on both end sides in the lateral direction (X direction) in the region corresponding to the opening 18. In addition, the transmitting piezoelectric element 17a is arranged in the region corresponding to the opening 18, for example, between the receiving piezoelectric elements 17b1 and 17b2 in the compressive deformation region (the second region having the minimum principal stress $\sigma_2$).

In addition, by optimizing the arrangement of each of the piezoelectric elements 17a, 17b1, and 17b2, it is possible to increase the transmission and reception sensitivity and to improve various characteristics of the ultrasonic sensor 1. Furthermore, as will be described in detail below, using the reverberation vibrations of the transmitting piezoelectric element 17a at the time of transmission by the ultrasonic sensor 1 makes it possible to function as a pseudo feedback circuit. That is, using the reverberation vibration, it is possible to grasp the driving situation of the transmitting piezoelectric element 17a in real time and, in addition, it becomes easy to further optimize the timing of receiving the reflected ultrasonic waves. Here, it is also possible to apply such a pseudo feedback circuit to other piezoelectric devices and, for example, it is possible to realize fault detection and the like in the ejection nozzle of the liquid injecting apparatus with a simple configuration.

In the piezoelectric element 17 of the ultrasonic sensor 1 of the present embodiment, each of the piezoelectric elements 17a, 17b1, and 17b2 is preferably formed such that the area occupied by the transmitting piezoelectric element 17a in the region corresponding to the opening 18 is larger than the total area occupied by the receiving piezoelectric elements 17b1 and 17b2. That is, when the surface area in the region corresponding to the opening 18 is Ao, the surface area exclusively occupied by the transmitting piezoelectric element 17a in that region is At, and the total surface area exclusively occupied by the receiving piezoelectric elements 17b1 and 17b2 is Ar, the above have the relationship shown in Equation (1). According to this, it is possible to further increase the transmission sensitivity of the transmitting piezoelectric element 17a, and it is possible to further improve various characteristics of the ultrasonic sensor 1.

$$(At/Ao) > (Ar/Ao) \quad (1)$$

The arrangement of the piezoelectric elements 17a, 17b1, and 17b2 is not limited to the example described above. In the present embodiment, in the ultrasonic sensor 1, as long as the receiving piezoelectric elements 17b1 and 17b2 are arranged in a region where the elongation deformation is the maximum (the maximum principal stress $\sigma_1$) and the reflected ultrasonic waves are easily received and the transmitting piezoelectric element 17a is arranged in a region where the compressive deformation is the maximum (the minimum principal stress $\sigma_2$) and the ultrasonic waves are easily transmitted, the number of each of the piezoelectric elements 17a, 17b1, and 17b2 to be arranged may be increased or decreased as necessary. In addition, it is also possible to appropriately determine the shapes of each of the piezoelectric elements 17a, 17b1, and 17b2 according to the shape of the opening 18 formed in the substrate 11.

For example, the receiving piezoelectric elements 17b1 and 17b2 may be respectively arranged on both end sides in the longitudinal direction (Y direction) in the region corresponding to the opening 18 when viewed from the vertical direction (Z direction). In addition, depending on the circular opening 18A formed in the substrate 11A of the second embodiment described below, the receiving piezoelectric elements 17b1 and 17b2 may be formed into shapes like that of the piezoelectric element 17A (refer to FIG. 7) formed of each of the piezoelectric elements 17aA, 17b1A, and 17b2A.

The transmitting piezoelectric element 17a is formed of a transmitting first electrode 14a, a transmitting piezoelectric layer 15a, and a second electrode 16 and the receiving piezoelectric elements 17b1 and 17b2 are formed of a receiving first electrode 14b, a receiving piezoelectric layer 15b and the second electrode 16. Among these piezoelectric elements 17a, 17b1, and 17b2, a portion where the transmitting first electrode 14a and the receiving first electrode 14b and the second electrode 16 overlap each other when viewed from the vertical direction (Z direction) is referred to as an active portion. The active portion is a region driven by the application of a voltage by the selected transmitting first electrode 14a or the receiving first electrode 14b and the second electrode 16, and is present in the movable portion (portion corresponding to the space 20) described above.

In the present embodiment, only the transmitting first electrode 14a and the receiving first electrode 14b may function as a vibrating plate without the vibrating plate 50 being provided. In a case where the transmitting first electrode 14a and the receiving first electrode 14b are directly provided on the substrate 11, it is preferable to protect the transmitting first electrode 14a and the receiving first electrode 14b with an insulating protective film or the like.

The transmitting first electrode 14a and the receiving first electrode 14b forming each of the piezoelectric elements 17a, 17b1, and 17b2 are patterned and formed for each opening 18 (space 20). The transmitting first electrode 14a and the receiving first electrode 14b are electrodes (comb-shaped electrodes) formed in a comb shape having mutually different widths in the lateral direction (X direction) of the comb teeth portions.

The transmitting first electrode 14a is formed of an electrode main portion 14a1 arranged outside the region corresponding to the opening 18 on the vibrating plate 50 (outside the region corresponding to the opening 18) and on one side (the −Y direction side) of the region corresponding to the opening 18, and a comb teeth portion 14a2 extending from the electrode main portion 14a1 toward the inside of the region corresponding to the opening 18.

In addition, the first electrode 14b for receiving is formed of an electrode main portion 14b1 arranged outside the region corresponding to the opening 18 and on the other side (+Y direction side) of the region corresponding to the opening 18, and two comb teeth portions 14b2 and 14b3 extending from the electrode main portion 14b1 toward the inside of the region corresponding to the opening 18.

In the transmitting first electrode 14a and the receiving first electrode 14b, these comb teeth portions 14a2, 14b2, and 14b3 are arranged to be opposed to each other in a staggered manner. That is, in the region corresponding to the opening 18, the comb teeth portion 14a2 is arranged so as to fit between the comb teeth portions 14b2 and 14b3.

In the present embodiment, in order that the relationship between the area occupied by the transmitting piezoelectric element 17a in the region corresponding to the opening 18 and the total area occupied by the receiving piezoelectric elements 17b1 and 17b2 satisfies Equation (1), the width of the comb teeth portion 14a2 of the transmitting first electrode 14a in the lateral direction (X direction) is larger than the total value of the widths of the comb teeth portions 14b2 and 14b3 of the receiving first electrode 14b in the lateral direction (X direction), and the comb teeth portions 14a2, 14b2, and 14b3 are formed so as to be accommodated in the region corresponding to the opening 18. However, the configuration is not limited thereto as long as the configuration is within the gist of the invention.

In addition, although the second electrode 16 is a common electrode extending in the X direction, the second electrode 16 is not limited thereto. For example, the second electrode 16 (upper electrode) may be patterned like the transmitting first electrode 14a and the receiving first electrode 14b, and the first electrode (lower electrode) may be used as the common electrode.

The material of the transmitting first electrode 14 a, the receiving first electrode 14 b, and the second electrode 16 may be an electrode material which does not oxidize when forming the above and which is able to maintain conductivity. Examples of such materials include metal materials such as platinum (Pt), iridium (Ir), gold (Au), aluminum (Al), copper (Cu), Ti, silver (Ag), or stainless steel; tin oxide-based conductive materials such as iridium oxide ($IrO_x$), indium tin oxide (ITO), and fluorine-doped tin oxide (FTC)), zinc oxide based conductive material such as gallium doped zinc oxide (GZO), oxide conductive materials such as strontium ruthenate ($SrRuO_3$), nickel acid lanthanum ($LaNiO_3$) and elemental doped strontium titanate; conductive polymers and the like. Among these, noble metals such as Pt and Ir are suitable. As the electrode material, any one of the above materials may be used alone, or a laminate in which a plurality of materials are laminated may be used. The electrode material of the transmitting first electrode 14a and the receiving first electrode 14b, and the electrode material of the second electrode 16 may be the same or different.

The transmitting piezoelectric layer 15a and the receiving piezoelectric layer 15b forming each of the piezoelectric elements 17a, 17b1, and 17b2 are patterned and formed for each opening 18 (space 20). Among these, the receiving piezoelectric layer 15b is formed of a first receiving piezoelectric layer 15b1 and a second receiving piezoelectric layer 15b2.

The end of the transmitting piezoelectric layer 15a on one side (the electrode main portion 14b1 side of the receiving first electrode 14b) in the longitudinal direction (+Y direction) covers the end of the comb teeth portion 14a2 of the transmitting first electrode 14a and is formed so as to be accommodated in the region corresponding to the opening 18, and, in addition, the end on the other side (the electrode main portion 14a1 side of the transmitting first electrode 14a) of the longitudinal direction (−Y direction) is formed so as to be accommodated in the region corresponding to the opening 18.

On the other hand, ends of the first receiving piezoelectric layer 15b1 and the second receiving piezoelectric layer 15b2 of the receiving piezoelectric layer 15b on one side (the electrode main portion 14a 1 side of the transmitting first electrode 14a) in the longitudinal direction (−Y direction) cover each of the ends of the comb teeth portions 14b2 and 14b3 of the receiving first electrode 14b and are formed so as to be accommodated in the region corresponding to the opening 18 and, in addition, the ends on the other side (the electrode main portion 14b1 side of the receiving first electrode 14b) in the longitudinal direction (+Y direction) are formed so as to be accommodated in the region corresponding to the opening 18.

In the present embodiment, the configurations of the transmitting piezoelectric layer 15a and the receiving piezoelectric layer 15b are formed such that the relationship between the area occupied by the transmitting piezoelectric element 17a in the region corresponding to the opening 18 and the total area occupied by the receiving piezoelectric elements 17b1 and 17b2 satisfy Equation (1); however, the configuration is not limited thereto as long as the configuration is within the gist of the invention.

For the transmitting piezoelectric layer 15a and the receiving piezoelectric layer 15b, it is possible to appropriately select the forming piezoelectric material as necessary as long as the material has an electromechanical conversion capability. Further, in the present embodiment, the transmitting piezoelectric layer 15a and the receiving piezoelectric layer 15b may be different. For example, a piezoelectric material having a high Young's modulus or a piezoelectric material including an additive for improving the Young's modulus may be used as a piezoelectric material suitable for the transmitting piezoelectric layer 15a. On the other hand, as a piezoelectric material suitable for the receiving piezoelectric layer 15b, a piezoelectric material having a low Young's modulus or a piezoelectric material including an additive for lowering the Young's modulus may be used. Setting the piezoelectric material of the transmitting piezoelectric layer 15a and the receiving piezoelectric layer 15b to have a different Young's modulus makes it possible to further increase the transmission and reception sensitivity of the transmitting piezoelectric element 17a and the receiving piezoelectric elements 17b1 and 17b2, and to further improve various characteristics of the ultrasonic sensor 1.

In general, examples of a piezoelectric material having an electromechanical conversion capability include a composite oxide having a perovskite structure (perovskite type composite oxide). The perovskite-type composite oxide is represented by, for example, General Formula $ABO_3$. In this case, the oxygen (O) atom of the A site is coordinated to 12, and the O atom of the B site is coordinated to 6 to form an octahedron (octahedron). Here, as long as the composite oxide is able to have a perovskite structure, not only are unavoidable deviations in the stoichiometric composition due to lattice mismatches, oxygen deficiency or excess, or the like allowed, but the partial substitution of elements or the like is also allowed, and these are included in the perovskite-type composite oxide of the present embodiment.

As a typical perovskite-type composite oxide, it is possible to use lead zirconate titanate (PZT) based composite oxide including lead (Pb), Zr (zirconium), and titanium (Ti), for example. Accordingly, it is easy to secure the displacement amount of the piezoelectric element 17 formed of the transmitting piezoelectric element 17a and the receiving piezoelectric elements 17b1 and 17b2. In addition, it is also possible to apply multicomponent composite oxides or the like based on lead magnesium niobate-lead titanate (PMN-PT) or based on lead magnesium niobate-lead zirconate titanate (PMN-PZT) including Pb, magnesium (Mg), and niobium (Nb).

In addition, as the transmitting piezoelectric layer 15a and the receiving piezoelectric layer 15b, a lead-free piezoelectric material not including lead may be used. It is also possible to use, for example, perovskite-type composite oxides such as a bismuth ferrate (BFO)-based composite oxide including bismuth (Bi) and iron (Fe), a bismuth ferrate-barium titanate (BF-BT)-based composite oxide including Bi, barium (Ba), Fe and Ti, a bismuth ferrate manganate-barium titanate (BFM-BT)-based composite oxide including Bi, Fe, manganese (Mn), Ba, and Ti, potassium sodium niobate (KNN)-based composite oxide including potassium (K), sodium (Na), and Nb, and bismuth ferrate tantalate (BFT) including Bi, Fe, and tantalum (Ta). Accordingly, it is possible to realize the transmitting piezoelectric element 17a and the receiving piezoelectric elements 17b1 and 17b2 using a non-lead-based material having less environmental load.

Among these piezoelectric materials, examples of piezoelectric materials having a high Young's modulus include PZT, piezoelectric materials in which hard elements such as Mg, Mo, Fe, and Si are added to PZT; BFO, BF-BT, BFM-BT, KNN, and the like, and examples of piezoelectric materials having a low Young's modulus include a relaxor material, piezoelectric materials in which a soft element such as La or Nb is added to PZT as a third added component, and the like. In the present embodiment, using a piezoelectric material having a high Young's modulus for the transmitting piezoelectric layer 15a makes it possible to set the transmitting piezoelectric element 17a in a region where the compressive deformation is the maximum (the minimum principal stress $\sigma_2$) and it is easy to transmit ultrasonic waves. On the other hand, using a piezoelectric material having a low Young's modulus for the receiving piezoelectric layer 15b makes it possible to set the receiving piezoelectric elements 17b1 and 17b2 in the region where the elongation deformation is the maximum (maximum principal stress $\sigma_1$) and it is easy to receive reflected ultrasonic waves. Due to this, it is possible to further improve the transmission and reception sensitivity and further improve various characteristics of the ultrasonic sensor 1.

In a case where an alkali metal such as K or Na is included in the piezoelectric material forming the transmitting piezoelectric layer 15a and the receiving piezoelectric layer 15b, the alkali metal may diffuse into the transmitting first electrode 14a and the receiving first electrode 14b. Therefore, in the present embodiment, by providing the insulating film 13 between the transmitting first electrode 14a and the receiving first electrode 14b and the substrate 11, the insulating film 13 has as a stopper function and it is possible to suppress the alkali metal from reaching the substrate 11.

In addition, a seed layer (also referred to as an orientation control layer) may be provided between the transmitting first electrode 14a and the receiving first electrode 14b and the transmitting piezoelectric layer 15a and the receiving piezoelectric layer 15b. The seed layer has a function of controlling the crystal orientation of the transmitting piezoelectric layer 15a and the receiving piezoelectric layer 15b. That is, providing the seed layer makes it possible to preferentially orient the crystals of the transmitting piezoelectric layer 15a and the receiving piezoelectric layer 15b in a predetermined plane orientation.

The material of the seed layer is not particularly limited as long as the material has an electromechanical conversion capability and functions as an orientation control layer of the transmitting piezoelectric layer 15a and the receiving piezoelectric layer 15b, and it is possible to appropriately select the material as necessary. For example, from the viewpoint of maintaining the crystallinity and piezoelectric characteristics of the transmitting piezoelectric layer 15a and the receiving piezoelectric layer 15b, it is preferable to use a piezoelectric material. The same piezoelectric material as that of the transmitting piezoelectric layer 15a and the receiving piezoelectric layer 15b may be used or a different piezoelectric material may be used. In the case where the transmitting piezoelectric layer 15a, the receiving piezoelectric layer 15b, and the seed layer have an electromechanical conversion capability, the above substantially function as a piezoelectric layer of the transmitting piezoelectric element 17a and the receiving piezoelectric elements 17b1 and 17b2.

The transmitting piezoelectric layer 15a and the receiving piezoelectric layer 15b are not limited to the above example and may be formed by including other elements, for example, it is preferable to further include Mn. Accordingly, the leakage current is easily suppressed, and for example, it is possible to realize the highly reliable transmitting piezoelectric element 17a and the receiving piezoelectric elements 17b1 and 17b2 with a lead-free material. In addition, the transmitting piezoelectric element 17a and the receiving piezoelectric elements 17b1 and 17b2 may be formed to include elements such as lithium (Li), Ba, calcium (Ca), strontium (Sr), Zr, Ti, Bi, Ta, antimony (Sb), Fe, cobalt (Co), Ag, Mg, zinc (Zn), and Cu. Also in the case of including such another element, the transmitting piezoelectric element 17a and the receiving piezoelectric elements 17b1 and 17b2 are preferably formed such that the composite oxide has a perovskite structure.

Among these additives, examples of additives for improving the Young's modulus include Mg, Mo, Fe, Si and the like, while examples of additives for lowering the Young's modulus include La, Nb, Ba, Zn, and the like. Using these makes it possible to improve various characteristics of the ultrasonic sensor 1 by improving the transmission and reception sensitivity.

One or more of these elements may be included. Generally, the added amount of the elements is 20% or less, 15% or less, or 10% or less with respect to the total amount of the element which is the main component. Using the elements improves various characteristics and makes it possible to diversify the configuration and functions. Also, even in a case of a composite oxide including these other elements, the transmitting piezoelectric element 17a and the receiving piezoelectric elements 17b1 and 17b2 are preferably formed so as to have a perovskite structure.

In the piezoelectric material, for example, a representative composition of the PMN-PT-based composite oxide is expressed as a mixed crystal of magnesium niobic acid and lead titanate. Such a mixed crystal is one in which it is not possible to individually detect magnesium niobic acid or lead titanate using an X-ray diffraction pattern. However, unless otherwise specified, the PMN-PT based composite oxide also includes compositions deviating from the composition of the mixed crystal.

Further, for example, the PMN-PT-based composite oxide is not limited to only the perovskite-type composite oxide including Pb, Mg, Nb, and Ti. That is, the PMN-PT based composite oxide includes a piezoelectric material expressed as a mixed crystal including a perovskite-type composite oxide containing Pb, Mg, Nb and Ti and another perovskite-type composite oxide.

In the present embodiment, in the transmitting piezoelectric element 17a and the receiving piezoelectric elements 17b1 and 17b2, it is preferable that the thickness of the elastic film 12 be set to 0.1 µm or more and 2 µm or less, the thickness of the insulating film 13 be set to 0.05 µm or more and 1 µm or less, the thicknesses of the transmitting first electrode 14a and the receiving first electrode 14b be set to 0.05 µm or more and 0.5 µm or less, and the thickness of the second electrode 16 be set to 0.05 µm or more and 0.5 µm or less. In addition, the transmitting piezoelectric layer 15a and the receiving piezoelectric layer 15b are thin films of 3 µm or less, and preferably 0.3 µm or more and 1.5 µm or less. At this time, the thickness of the transmitting piezoelectric layer 15a may be smaller than the thickness of the receiving piezoelectric layer 15b. According to this, it is possible to further increase the transmission sensitivity of the transmitting piezoelectric element 17a, and it is possible to further improve various characteristics of the ultrasonic sensor 1. The thicknesses of each of the elements listed here are just examples and are able to be changed within a range not changing the gist of the invention.

Ultrasonic Sensor Control System and Driving Method

The ultrasonic probe I in FIG. 1 is formed to include an ultrasonic sensor 1 electrically connected to a driving circuit (not shown), and a control apparatus (not shown) for controlling driving of the ultrasonic sensor 1. The control apparatus is formed to include, for example, an external interface (external I/F), a RAM for temporarily storing various kinds of data, a ROM storing a control program and the like, a control unit including a CPU and the like, an oscillation circuit generating a clock signal, a driving signal forming circuit for generating a driving signal for supplying to the ultrasonic sensor 1, a power generating unit for generating a power source for use in the driving signal forming circuit, an internal interface (internal I/F) for transmitting a clock signal, a driving signal, and the like to the driving circuit, and the like. Among these, the power generating unit supplies driving power to the driving signal forming circuit. Then, the driving signal forming circuit generates a driving signal based on the driving power generated by the power generating unit. In addition, a COM signal or a drive waveform, as well as a predetermined sensor control signal (a clock signal (CLK), a latch signal (LAT), a change signal (CH), pixel data (SI), setting data (SP), and the like) are input to the driving circuit of the ultrasonic sensor 1 via a connection wiring from various sections. Furthermore, the control apparatus is mainly formed based on a microcomputer having a known configuration. Specifically, the operation of each section of the control apparatus is realized by the execution of a program by a microcomputer. Providing the above control apparatus makes it possible to provide the ultrasonic sensor 1 capable of realizing the driving method of the piezoelectric element 17 according to the present embodiment.

In the ultrasonic sensor 1, the piezoelectric element 17 and the vibrating plate 50 are collectively referred to as an actuator device. Within this actuator device, in the transmitting piezoelectric element 17a and the receiving piezoelectric elements 17b1 and 17b2 forming the piezoelectric element 17 of FIG. 3, the transmitting first electrode 14a and the receiving first electrode 14b and the second electrode 16 are electrically connected to a driving circuit (not shown). By inputting a COM signal to either one of each of the first electrodes 14a and 14b and the second electrode 16 from the driving circuit and a predetermined drive waveform (input waveform) to the other, a voltage is applied to each of the piezoelectric elements 17a, 17b1, and 17b2, polarization is generated in the transmitting piezoelectric layer 15a and the receiving piezoelectric layer 15b, and each of the piezoelectric elements 17a, 17b1, 17b2, and the vibrating plate 50 is displaced so as to transmit and receive ultrasonic waves. In addition, when the piezoelectric elements 17a, 17b1, and 17b2 are displaced, polarization is generated in each of the piezoelectric layers 15a and 15b to generate a surface charge. The surface charge is detected as a voltage in the driving circuit.

Here, the predetermined driving waveform is a waveform showing the potential state applied to the other electrode with respect to the electrode to which the COM signal is input, and is a unit of a waveform showing changes in the series of driving voltages which, after each piezoelectric element 17a, 17b1, and 17b2 is displaced (or deformed) from a reference state (reference potential), drives each of the piezoelectric elements 17a, 17b1, and 17b2 so as to return to the reference state again. After each piezoelectric element 17a, 17b1, and 17b2 is displaced (or deformed) from a reference state, the driving for returning to the reference state again is carried out by a series of steps for changing the voltage (that is, the voltage applied to each of the piezoelectric layers 15a and 15b) applied between each of the first electrodes 14a and 14b and the second electrode 16.

In the present embodiment, at the time of transmitting ultrasonic waves, by applying a voltage to the transmitting piezoelectric element 17a, compressive deformation (distortion) is generated in the transmitting piezoelectric layer 15a, and the vibrating plate 50 vibrates according to this distortion, thereby transmitting ultrasonic waves to the object to be measured. On the other hand, since voltage is not applied to the receiving piezoelectric elements 17b1 and 17b2 at the time of transmitting ultrasonic waves, when the reverberation vibration is received by the receiving piezoelectric elements 17b1 and 17b2 at the time when the vibrating plate 50 vibrates due to the driving of the transmitting piezoelectric element 17a immediately after the transmission, polarization is generated in the receiving piezoelectric layer 15b and a surface charge is generated. The surface charge is detected as a voltage in the driving circuit. As a result, it is possible to grasp the driving situation of the transmitting piezoelectric element 17a in real time, to detect the timing of the reception of reflected ultrasonic waves to be described below, and to function as a pseudo feedback circuit.

On the other hand, when receiving the reflected ultrasonic waves (sound pressure) reflected from the object to be measured, the sound pressure is received by the transmitting piezoelectric element 17a and the receiving piezoelectric elements 17b1 and 17b2, polarization is generated in the transmitting piezoelectric layer 15a and the receiving piezoelectric layer 15b to generate a surface charge, and this surface charge is detected as a voltage in the driving circuit. At this time, the voltage according to the receiving piezoelectric elements 17b1 and 17b2 may be calculated and processed to be extracted as a reflection signal, or the voltages according to the transmitting piezoelectric element 17a and the receiving piezoelectric elements 17b1 and 17b2 may be calculated and processed to extract a reflection signal. However, the receiving piezoelectric elements 17b1 and 17b2 arranged in the region corresponding to the opening 18 are deformed by being expanded and contracted, but the transmitting piezoelectric element 17a arranged in the region corresponding to the opening 18 is compressively deformed, thus, the reflection signals derived from the transmitting piezoelectric element 17a and the receiving piezoelectric elements 17b1 and 17b2 are signals which are close to opposite phases, and delay may also be considered, so complicated signal processing (calculation processing) is necessary.

Method for Manufacturing Ultrasonic Sensor

Figure 5:
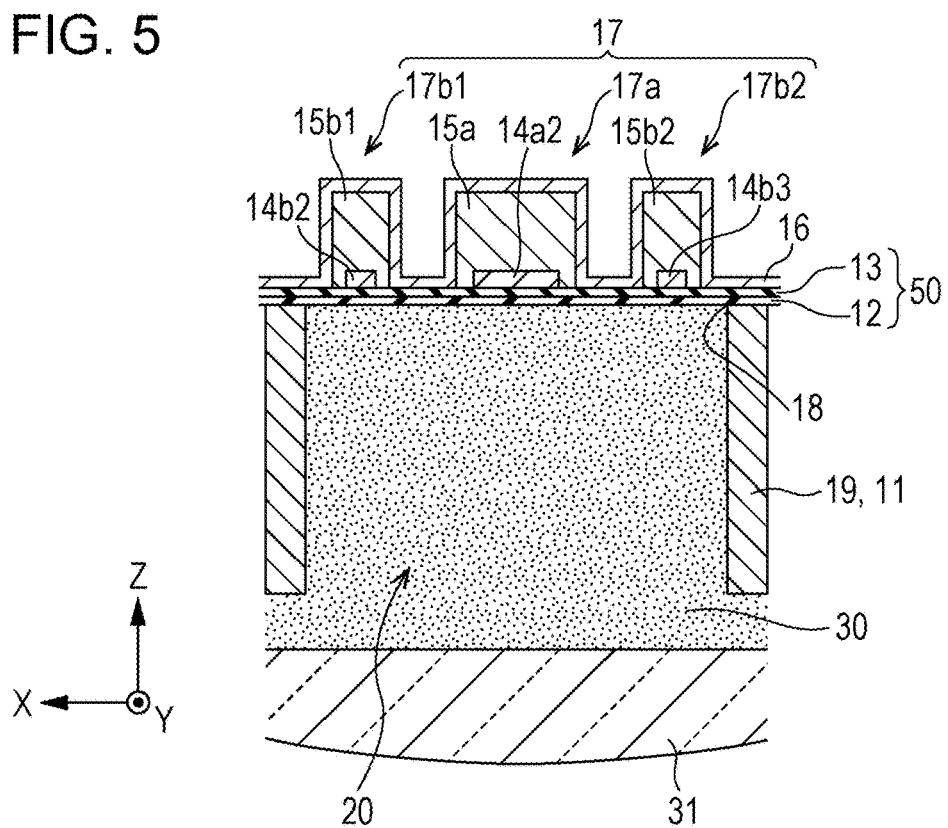
FIG. 5 is a cross-sectional view illustrating a manufacturing example of the ultrasonic sensor according to the first embodiment.
Figure 6:
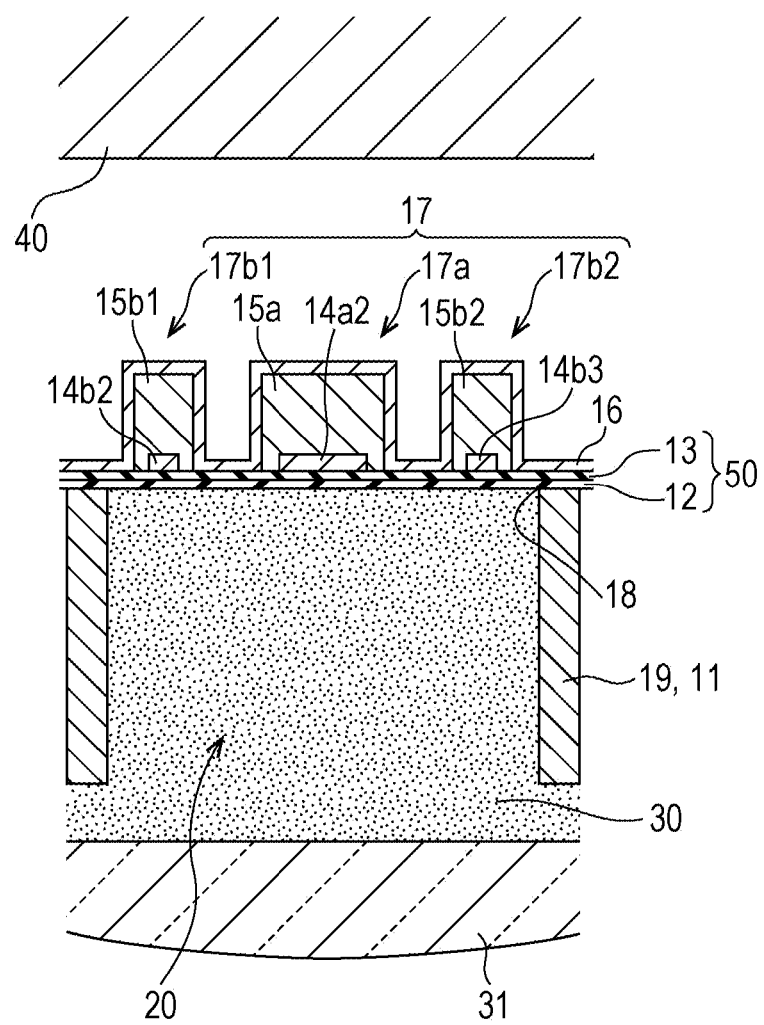
FIG. 6 is a cross-sectional view illustrating a manufacturing example of the ultrasonic sensor according to the first embodiment.

A description will be given of an example of a method for manufacturing the ultrasonic sensor 1 with reference to the drawings. FIG. 5 and FIG. 6 are cross-sectional views illustrating a manufacturing example of the ultrasonic sensor according to the first embodiment. As shown in FIG. 3, the transmitting first electrode 14a is formed of an electrode main portion 14a1 and a comb teeth portion 14a2, the receiving first electrode 14b is formed of an electrode main portion 14b1 and comb teeth portions 14b2 and 14b3, and the receiving piezoelectric layer 15b is formed of a first receiving piezoelectric layer 15b1 and a second receiving piezoelectric layer 15b2.

First, as shown in FIG. 5, a silicon (Si) substrate is prepared as the substrate 11. Next, the substrate 11 is thermally oxidized to form an elastic film 12 made of silicon dioxide ($SiO_2$) on the surface thereof. Furthermore, a zirconium film is formed on the elastic film 12 by a sputtering method, a vapor deposition method, or the like, and the insulating film 13 made of zirconium oxide ($ZrO_2$) is obtained by thermal oxidation thereof. In this manner, the vibrating plate 50 formed of the elastic film 12 and the insulating film 13 is formed on the substrate 11.

Next, a first electrode film is formed on the insulating film 13 of the vibrating plate 50, and the transmitting first electrode 14a and the receiving first electrode 14b are formed by patterning described below. It is possible to form the first electrode film by a gas phase method such as a sputtering method, a physical vapor deposition method (PVD method), a laser ablation method or the like, or by a liquid phase method such as a chemical solution method (a wet method) such as a Metal-Organic Decomposition (MOD) method or a sol-gel method, or the like. Next, a resist (not shown) with a predetermined shape is formed on the first electrode as a mask, the first electrode film is patterned to form, for example, the transmitting first electrode 14a and the receiving first electrode 14b as shown in FIG. 3. It is possible to carry out the patterning of the first electrode film by dry etching such as reactive ion etching (RIE), ion milling, or the like, or wet etching using an etching solution. The shape of the first electrode film in the patterning is not limited to the transmitting first electrode 14a and the receiving first electrode 14b shown in FIG. 3.

Next, a piezoelectric layer formed of a plurality of piezoelectric films is formed on the vibrating plate 50 on which the transmitting first electrode 14a and the receiving first electrode 14b are formed, and the transmitting piezoelectric layer 15a and the receiving piezoelectric layer 15b are formed by the patterning described above. The method for forming the piezoelectric layer is not limited. For example, it is possible to form the piezoelectric layer by a chemical solution method (wet method) such as an MOD method or a sol-gel method in which a solution (precursor solution) including a metal complex is coated and dried and further fired at a high temperature to obtain a metal oxide. In addition, it is possible to form the piezoelectric layer by a gas phase method such as a laser ablation method, a sputtering method, a pulse laser deposition method (PLD method), a Chemical Vapor Deposition (CVD) method, and an aerosol deposition method, by a liquid phase method, or by a solid phase method.

For example, although a description will be given below of the piezoelectric layer formed by a wet method (liquid phase method); however, there is a plurality of piezoelectric films formed by a series of steps from a step of coating a precursor solution to form a precursor film (coating step), a step of drying the precursor film (drying step), a step of heating and degreasing the dried precursor film (degreasing step), and a step of firing the degreased precursor film (firing step). That is, the piezoelectric layer is formed by repeating the series of steps from the coating step to the firing step a plurality of times. Here, in the series of steps described above, after the coating step to the degreasing step are repeated a plurality of times, the firing step may be carried out.

Layers and films formed by a wet method have interfaces. In the layer or film formed by the wet method, traces of the coating or firing remain and such traces are "interfaces" which are able to be confirmed by being observed in the cross-section or by analysis of the concentration distribution of elements in the layer (or in the film). Strictly speaking, "interface" means a boundary between layers or between films, but here the interface means in the vicinity of a boundary of a layer or a film. In a case where a cross-section of a layer or a film formed by a wet method is observed with an electron microscope or the like, such an interface is confirmed as a portion where the color is darker than the other portions or a portion where the color is lighter than the other portion in the vicinity of the boundary with the adjacent layer or film. In addition, in a case of analyzing the concentration distribution of elements, such an interface is confirmed as a portion having a higher concentration of elements than other portions or a portion having a lower element concentration than the other portions in the vicinity of the boundary with the adjacent layer or film. The piezoelectric layer is formed (formed of a plurality of piezoelectric films) by repeating a series of steps from a coating step to a firing step a plurality of times, or repeating a coating step to a degreasing step a plurality of times and then performing a firing step, thus, there are a plurality of interfaces corresponding to each of the piezoelectric films.

An example of a specific procedure in a case where the piezoelectric layer is formed by a wet method is as follows. First, precursor solutions formed of a MOD solution including a metal complex or a sol for forming the piezoelectric layer are respectively adjusted (adjustment step). Then, the precursor solution of the piezoelectric layer is coated on the vibrating plate 50 on which the transmitting first electrode 14a and the receiving first electrode 14b are formed by a spin coating method or the like to form a precursor film (coating step). Next, the precursor film is heated to, a predetermined temperature, for example, approximately 130° C. to 250° C. and dried for a certain period of time (drying step), and the dried precursor film is degreased by being further heated to a predetermined temperature, for example, approximately 300° C. to 450° C. and being held for a certain period of time (degreasing step). Further, the degreased precursor film is crystallized by being heated to a higher temperature, for example, to approximately 500° C. to 800° C., and held at this temperature for a certain period of time, thereby forming the piezoelectric film (firing step). Then, the coating step, drying step, degreasing step, and firing step described above are repeated a plurality of times to form the piezoelectric layer formed of the plurality of piezoelectric films.

Each of the precursor solutions described above is obtained by dissolving or dispersing a metal complex capable of forming the perovskite-type composite oxide described above by firing in an organic solvent. That is, the precursor solution of the piezoelectric layer includes a predetermined element as the central metal of the metal complex. At this time, a metal complex including an element other than the above element may be further mixed in the precursor solution of the piezoelectric layer.

As the metal complex including each of the elements described above, it is possible to use, for example, an alkoxide, an organic acid salt, a β-diketone complex, or the like. In each of the precursor solutions described above, the mixing ratio of these metal complexes may be mixed such that each of the predetermined elements included in the perovskite-type composite oxide has a desired molar ratio. At this time, two or more kinds of metal complexes may be used in a combination.

Examples of the organic solvent used for preparing the precursor solution include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, and the like, mixed solvents thereof, and the like.

The precursor solution may include additives which stabilize the dispersion of each metal complex. Examples of such additives include 2-ethylhexanoic acid, diethanolamine, and the like.

Examples of the heating apparatus used in the drying step, the degreasing step and the firing step include a Rapid Thermal Annealing (RTA) apparatus which heats by irradiation with an infrared lamp, a hot plate, and the like.

Next, the piezoelectric layer formed of a plurality of piezoelectric films is patterned by, for example, the same method as the first electrode film, to form the transmitting piezoelectric layer 15a and the receiving piezoelectric layer 15b shown in FIG. 3. The shape of the piezoelectric layer in the patterning is not limited to that of the transmitting piezoelectric layer 15a and the receiving piezoelectric layer 15b shown in FIG. 3.

Next, a second electrode film is formed on the vibrating plate 50 formed up to the transmitting piezoelectric layer 15a and the receiving piezoelectric layer 15b, and patterned to form the second electrode 16. Here, for the forming method of the second electrode film, it is possible to apply the same method as for the first electrode film and, for the patterning method of the second electrode film, it is possible to use the same method as for the transmitting first electrode 14a and the receiving first electrode 14b.

Before and after forming the second electrode film on the piezoelectric layer, a reheating treatment (post annealing) may be performed in a temperature range of approximately 600° C. to 800° C. as necessary. Performing post-annealing in this manner makes it possible to form a favorable interface and to improve the crystallinity of the piezoelectric layer.

Next, a mask film (not shown) is formed on the surface of the substrate 11 opposite to the piezoelectric element 17, and patterned into a predetermined shape. Then, anisotropic etching (wet etching) using an alkaline solution such as KOH is carried out on the substrate 11 via the mask film, and the substrate 11 is partitioned by a plurality of partitions 19 to form the space 20. The inside of this space 20 is an air layer.

Next, the fluid material described above is injected into the space 20, and the fluid material is cured to form an acoustic matching layer 30 having a thickness of 80 μm to 100 μm and a flat surface, and the prepared lens member 31 is attached thereto. The thickness of the lens member 31 is 200 μm, but in order to form an ultrasonic beam, a portion (lens portion) corresponding to the piezoelectric element 17 is formed in a curved shape, and the thickness of the maximum thick portion is 600 μm. However, the lens member 31 is not limited to these thicknesses.

Next, as shown in FIG. 6, the unnecessary portion is cut and removed by dicing or the like, and the enveloping plate 40 and the vibrating plate 50 are adhered or bonded to each other via the edge 40a and the support member 41 (refer to FIG. 1, and the like) using a normal method for forming the ultrasonic sensor 1 shown in FIG. 1.

Second Embodiment

Ultrasonic Sensor

Figure 7:
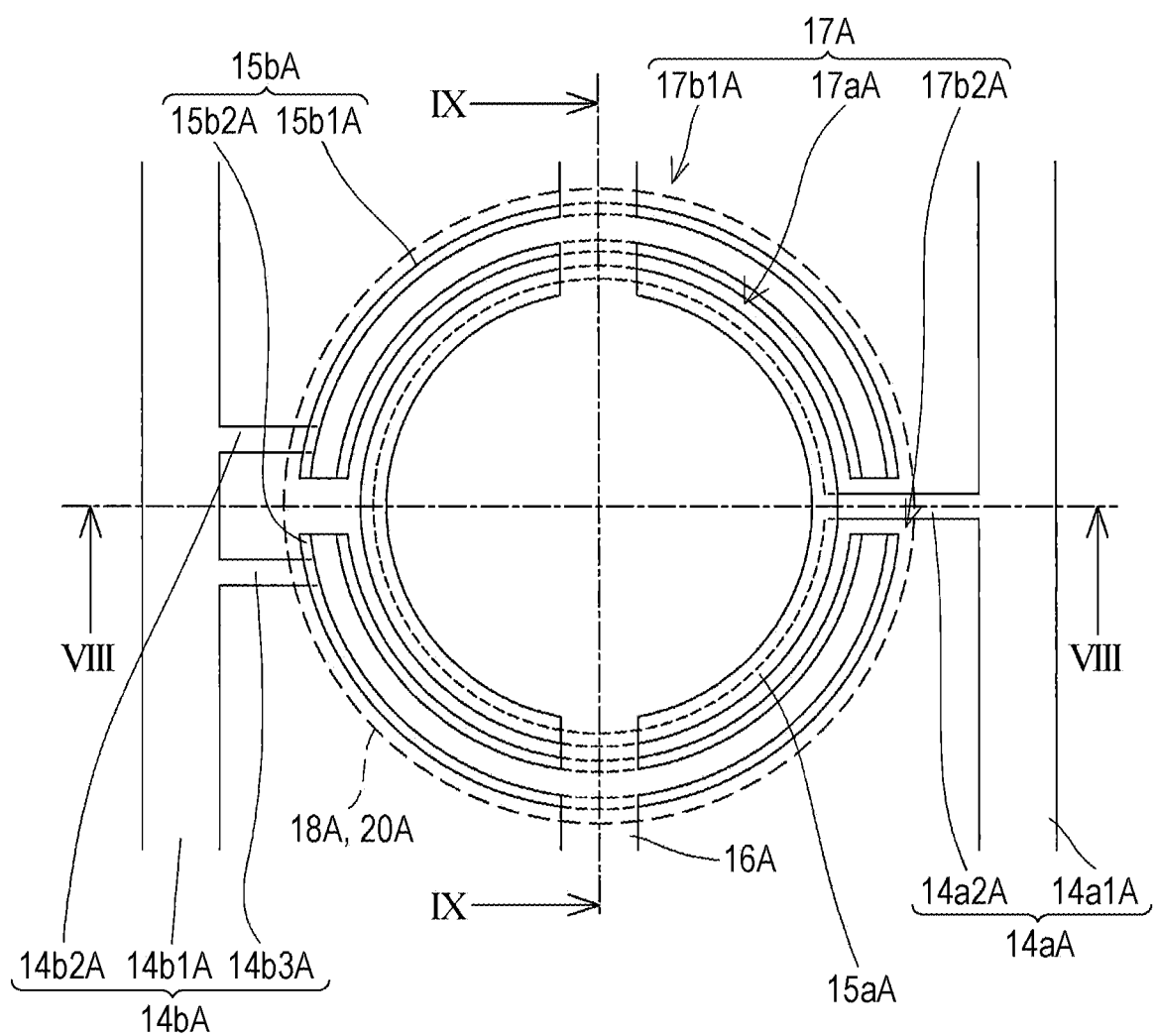
FIG. 7 is a plan view showing a configuration example of a piezoelectric element according to a second embodiment.
Figure 8:
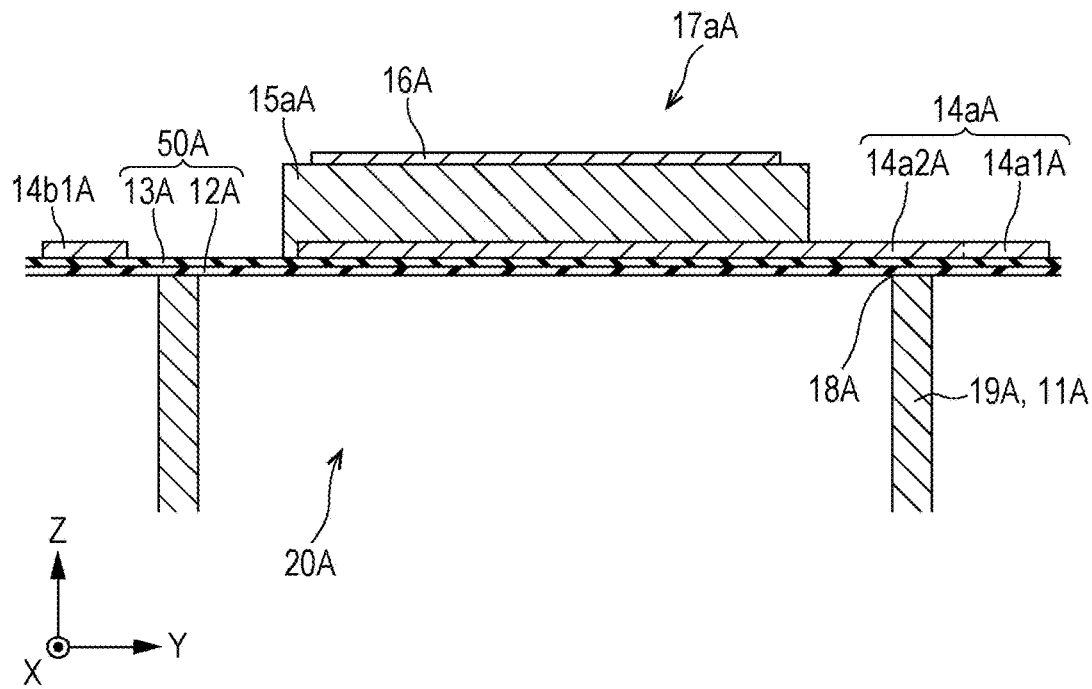
FIG. 8 is a cross-sectional view taken along line VIII-VIII of FIG. 7.
Figure 9:
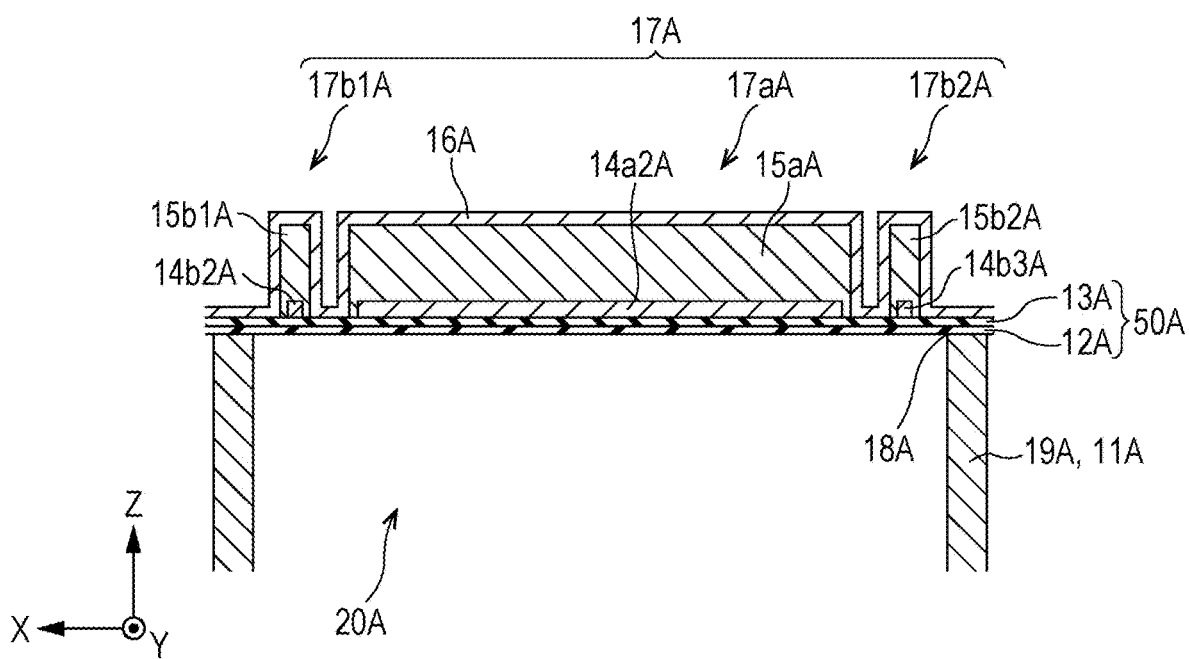
FIG. 9 is a cross-sectional view taken along line IX-IX of FIG. 7.

The ultrasonic sensor 1 of the present embodiment is the same ultrasonic sensor as the first embodiment except that the configuration of the piezoelectric element 17 and the opening 18 (space 20) of the first embodiment is changed. Accordingly, in the present embodiment, a description will be given of mainly the configuration of the piezoelectric element and the opening (space), and explanation of other configurations will be omitted as appropriate. FIG. 7 is a plan view showing a configuration example of the piezoelectric element of the second embodiment, FIG. 8 is a cross-sectional view taken along line VIII-VIII of FIG. 7, and FIG. 9 is a cross-sectional view taken along line IX-IX of FIG. 7. As shown in the diagrams, when viewing a piezoelectric element 17A on a vibrating plate 50A formed of an elastic film 12A and an insulating film 13A from the vertical direction (Z direction), the piezoelectric element 17A is provided at a position (a position opposed to the opening 18A) opposed to the opening 18A (space 20A) with a circular shape on the vibrating plate 50A, and is arranged in the region (region corresponding to the opening 18A) corresponding to the circular opening 18A on the vibrating plate 50A.

The circular opening 18A is formed in a region corresponding to the piezoelectric element 17A on the vibrating plate 50A, and is partitioned by a circular partition 19A to form a space 20A. That is, the space 20A is provided penetrating the substrate 11A in the thickness direction (Z direction) and has a columnar shape and, when the substrate 11A is viewed from the vertical direction (Z direction), the opening 18A has a circular shape.

The piezoelectric element 17A is formed of one transmitting piezoelectric element 17aA and two receiving piezoelectric elements 17b1A and 17b2A and the above are provided at positions opposed to one opening 18A on the vibrating plate 50A and arranged in a region corresponding to one of the openings 18A. Accordingly, when viewed from the vertical direction (Z direction), the receiving piezoelectric elements 17b1A and 17b2A are respectively arranged along the peripheral edge in the region corresponding to the opening 18A and have arcuate shapes. On the other hand, when viewed from the vertical direction (Z direction), the transmitting piezoelectric element 17aA is arranged in a space formed by the receiving piezoelectric elements 17b1 and 17b2 so as to be spaced apart and not in contact with each other and the shape thereof is circular. That is, the piezoelectric element 17A is accommodated in a region corresponding to the opening 18A in a state where the circular transmitting piezoelectric element 17aA is arranged in the space formed by the arcuate-shaped receiving piezoelectric elements 17b1A and 17b2A.

In the piezoelectric element 17A, the receiving piezoelectric elements 17b1A and 17b2A are arranged in a region where the elongation deformation is the maximum (the maximum principal stress $\sigma_1$) and it is easy to receive the reflected ultrasonic waves and the transmitting piezoelectric element 17aA is arranged in a region where the compressive deformation is the maximum (the minimum principal stress $\sigma_2$) and it is easy to transmit ultrasonic waves, making it possible to arrange each of the transmitting and receiving piezoelectric elements 17aA, 17b1A, and 17b2A in the region corresponding to one opening 18A, and to achieve high integration of the ultrasonic sensor.

Here, the transmitting piezoelectric element 17aA is formed of a transmitting first electrode 14aA formed of an electrode main portion 14a1A and a disk portion 14a2A, a transmitting piezoelectric layer 15aA, and a second electrode 16A. In addition, the receiving piezoelectric elements 17b1A and 17b2A are formed of a first receiving electrode 14bA formed of the electrode main portion 14b1A and the circular portions 14b2A and 14b3A and a receiving piezoelectric layer 15bA formed of a first receiving piezoelectric layer 15b1A and a second receiving piezoelectric layer 15b2A, and a second electrode 16A. The constituent elements of each piezoelectric element 17aA, 17b1A, and 17b2A may be appropriately formed so as to have a shape which allows the above arrangement (in particular, the shape shown in FIG. 7).

Here, in the present embodiment, it is preferable that the relationship between the occupied areas of the respective piezoelectric elements 17aA, 17b1A, and 17b2A and the relationship between the materials and the thicknesses of the respective piezoelectric layers 15aA, 15bA be configured in the same manner as the first embodiment.

EXAMPLES

A more specific description will be given below of the invention with reference to Examples. The invention is not limited to the following Examples.

Example 1

Figure 10:
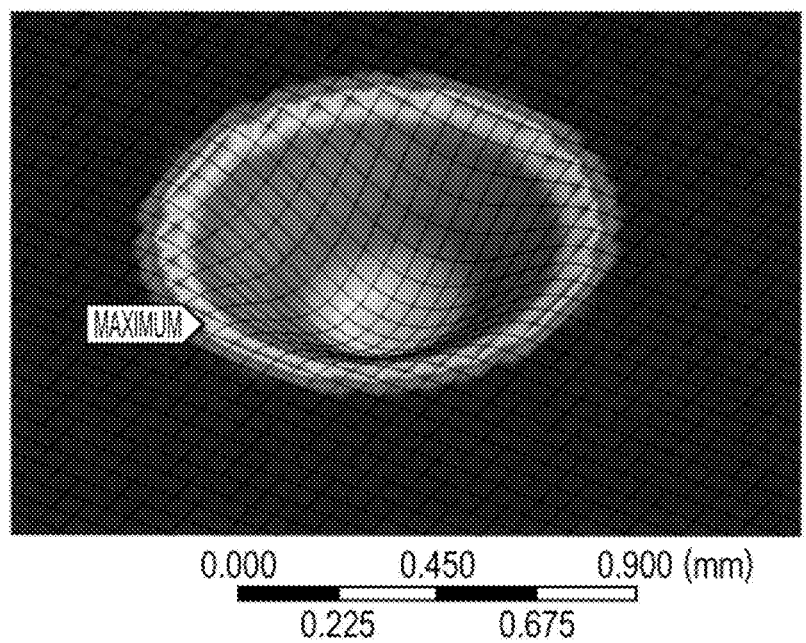
FIG. 10 is a diagram showing model calculation results of von Mises stress of vibrating plate deformation of Example 1.
Figure 11:
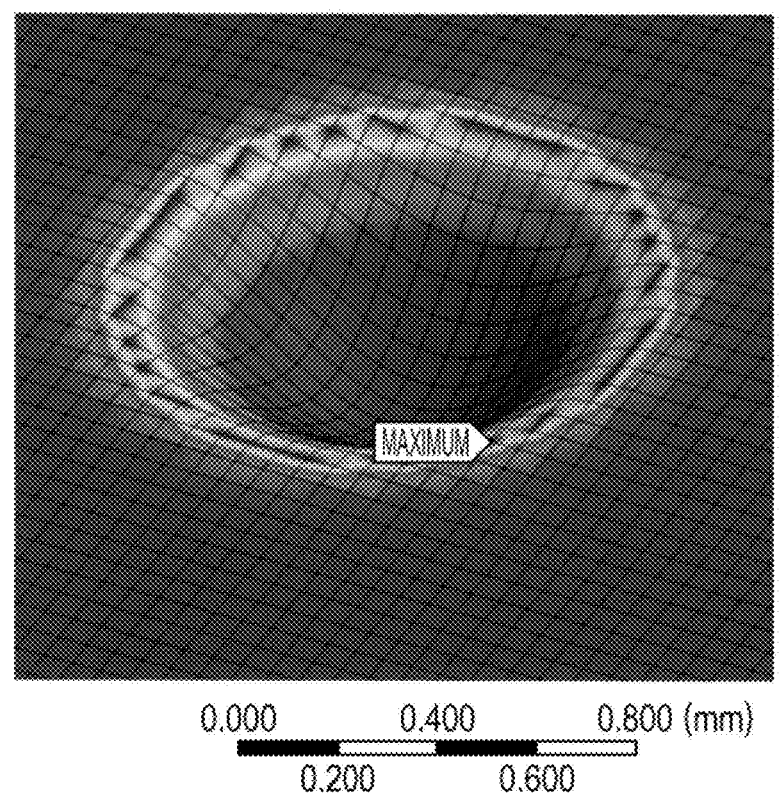
FIG. 11 is a diagram showing model calculation results of the maximum principal stress of vibrating plate deformation of Example 1.
Figure 12:
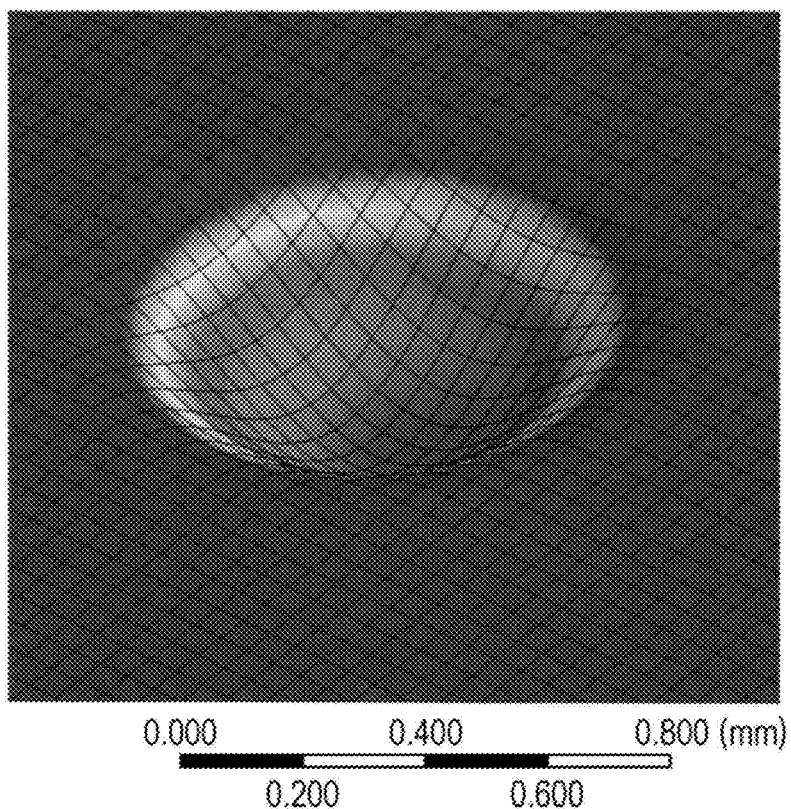
FIG. 12 is a diagram showing model calculation results of the minimum principal stress of vibrating plate deformation of Example 1.

First, only the vibrating plate 50 was formed on the substrate 11 having a circle CAV configuration with a diameter of 1000 μm (refer to the configuration of the space 20A in the second embodiment shown in FIG. 7), and model calculation of von Mises stress, maximum principal stress, and minimum principal stress was performed for the deformation of the vibrating plate 50 in a case where force corresponding to a sound pressure of 10 Pa is applied thereto. FIG. 10 is a diagram showing a model calculation result of the von Mises stress of the vibrating plate deformation of Example 1, FIG. 11 is a diagram showing a model calculation result of the maximum principal stress of the vibrating plate deformation of Example 1, and FIG. 12 is a diagram showing a model calculation result of the minimum principal stress of the vibrating plate deformation of Example 1. As shown in the diagrams, the region where the maximum principal stress is large is blue, and the region where the minimum principal stress is large is red. That is, as in the piezoelectric element 17A of the second embodiment, when the transmitting piezoelectric element 17aA is arranged in the blue region and the receiving piezoelectric elements 17b1A and 17b2A are arranged in the red region, it is possible to improve various characteristics of the ultrasonic sensor on which the piezoelectric element 17A is mounted and to function as a pseudo feedback circuit of the transmitting piezoelectric element 17aA.

Example 2

Figure 13:
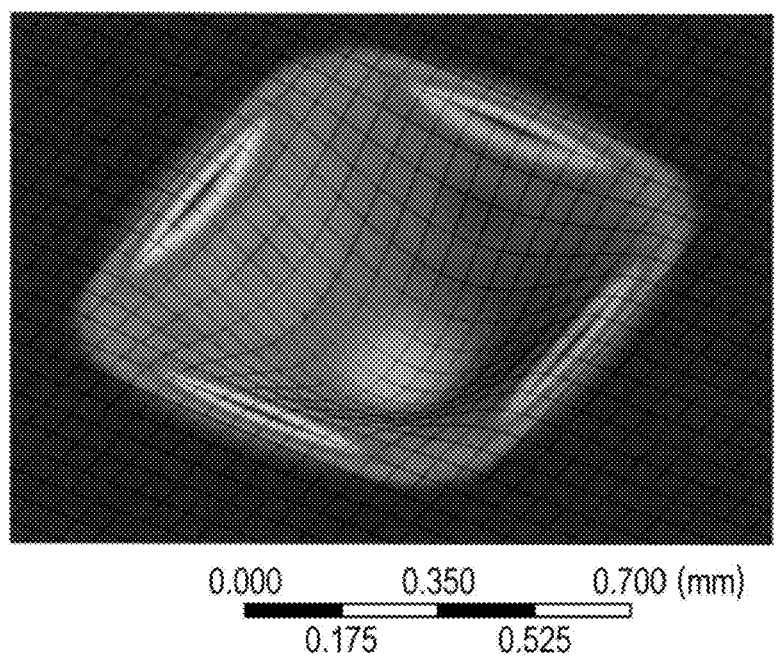
FIG. 13 is a diagram showing model calculation results of von Mises stress of vibrating plate deformation of Example 2.
Figure 14:
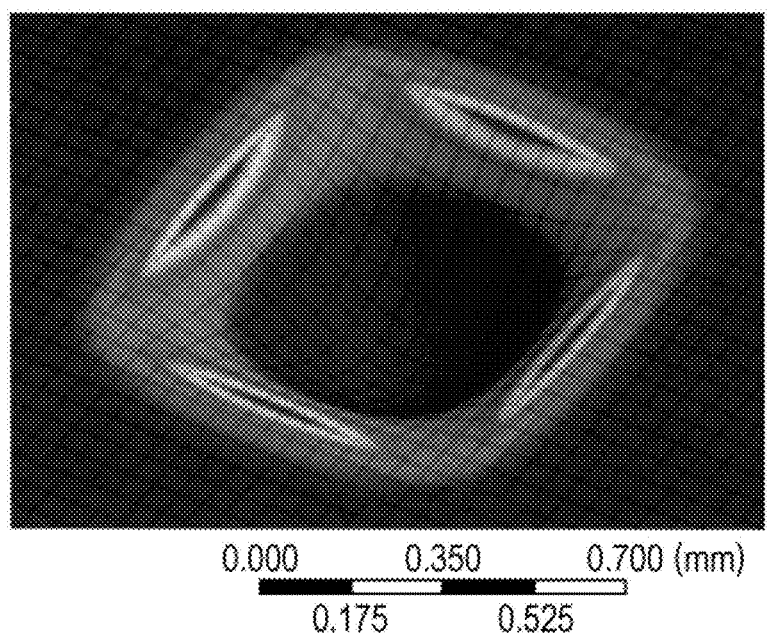
FIG. 14 is a diagram showing model calculation results of the maximum principal stress of vibrating plate deformation of Example 2.
Figure 15:
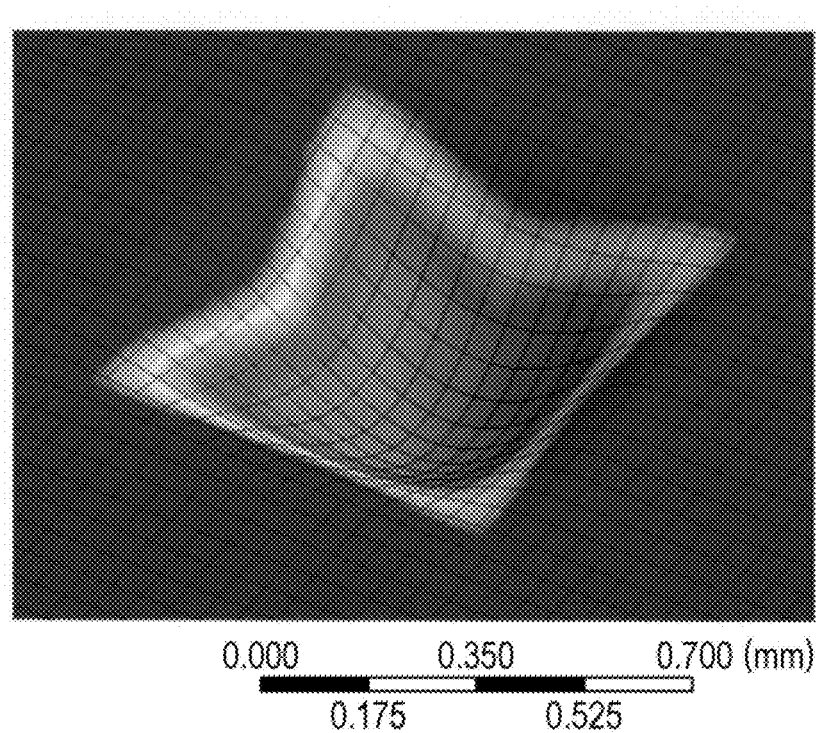
FIG. 15 is a diagram showing model calculation results of the minimum principal stress of vibrating plate deformation of Example 2.

A model calculation of the Muses stress, the maximum principal stress, and minimum principal stress was carried out in the same manner as in Example 1 except that the CAV configuration of the substrate 11 was formed in a square shape (the ratio of the lengths in the X direction and in the Y direction was 1:1). FIG. 13 is a diagram showing a model calculation result of the von Mises stress of the vibrating plate deformation of Example 2, FIG. 14 is a diagram showing a model calculation result of the maximum principal stress of the vibrating plate deformation of Example 2, and FIG. 15 is a diagram showing the model calculation result of the minimum principal stress of the vibrating plate deformation of Example 2. As shown in the diagrams, the region where the maximum principal stress is large is blue, and the region where the minimum principal stress is large is red. That is, when the transmitting piezoelectric element is arranged in the blue region and the receiving piezoelectric element is arranged in the red region, it is possible to obtain the same effect as in the first embodiment.

Example 3

Figure 16:
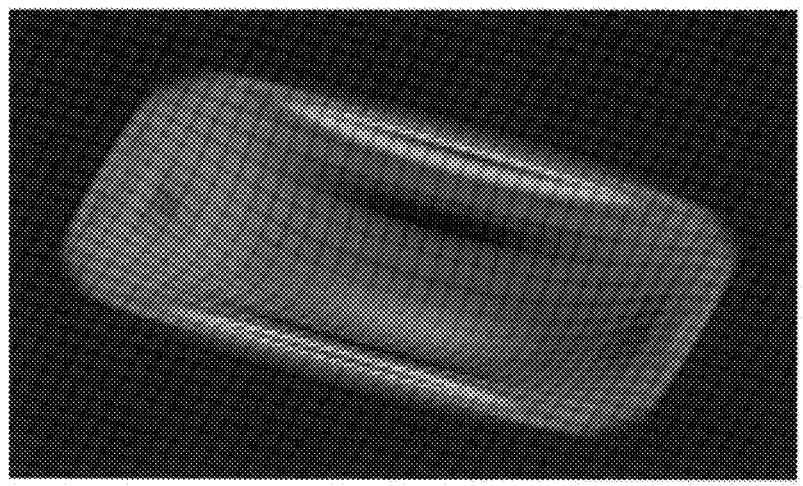
FIG. 16 is a diagram showing model calculation results of von Mises stress of vibrating plate deformation of Example 3.
Figure 17:
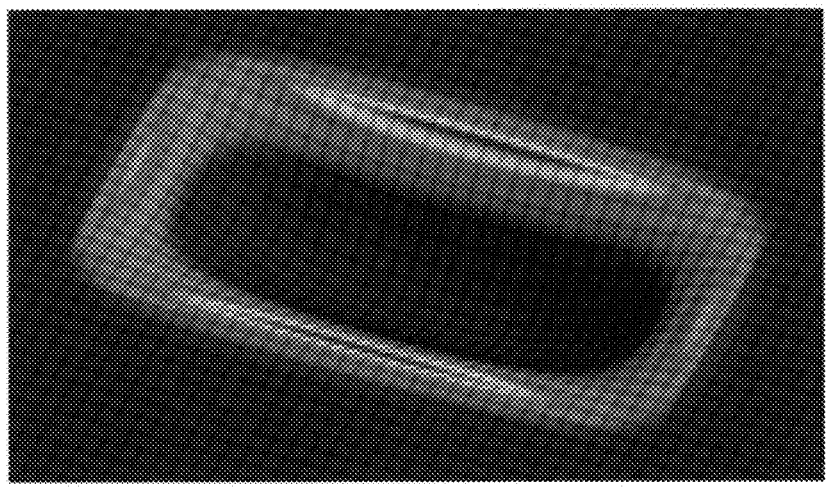
FIG. 17 is a diagram showing model calculation results of the maximum principal stress of vibrating plate deformation of Example 3.
Figure 18:
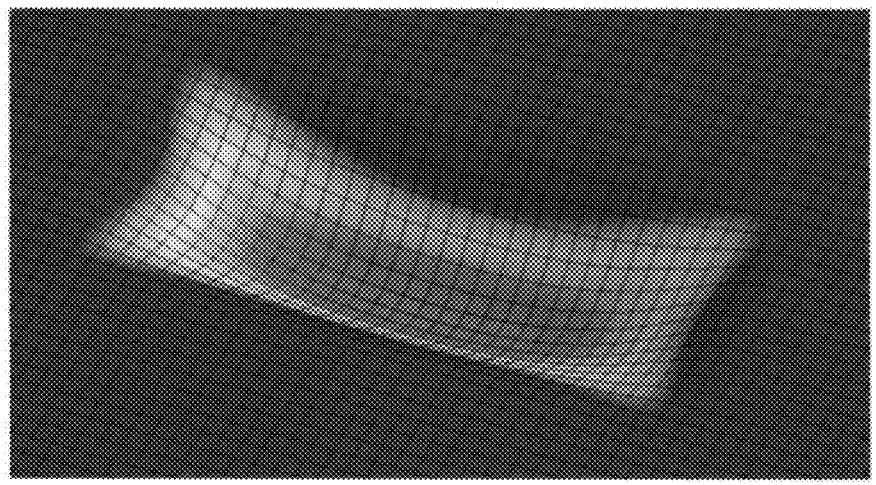
FIG. 18 is a diagram showing model calculation results of the minimum principal stress of vibrating plate deformation of Example 3.

A model calculation of the von Mises stress, the maximum principal stress, and minimum principal stress was carried out in the same manner as in Example 1 except that the CAV configuration (refer to the configuration of the space 20 of the first embodiment shown in FIG. 3) of the substrate 11 was formed in a rectangular shape (the ratio of the lengths in the X direction and in the Y direction was 1:2). FIG. 16 is a diagram showing the model calculation result of the von Mises stress of the vibrating plate deformation of Example 3, FIG. 17 is a diagram showing the model calculation result of the maximum principal stress of the vibrating plate deformation of Example 3, and FIG. 18 is a diagram showing a model calculation result of minimum principal stress of vibrating plate deformation of Example 3. As shown in the diagrams, the region where the maximum principal stress is large is blue, and the region where the minimum principal stress is large is red. That is, as in the piezoelectric element 17 in the first embodiment, when the transmitting piezoelectric element 17a is arranged in the blue region and the receiving piezoelectric elements 17b1 and 17b2 are arranged in the red region, it is possible to obtain the same effect as in the first embodiment.

Example 4

Figure 19:
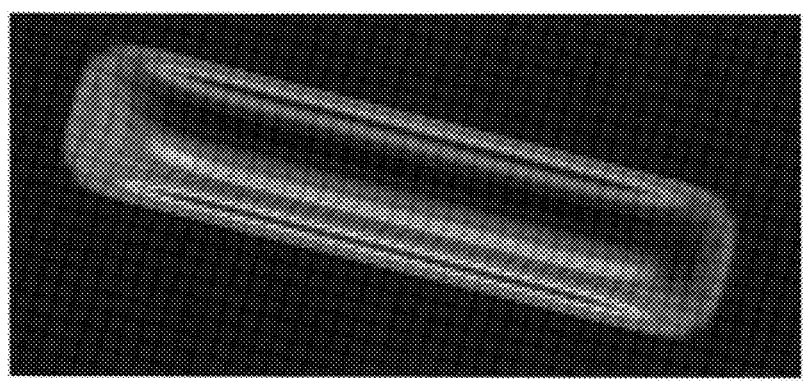
FIG. 19 is a diagram showing model calculation results of von Mises stress of vibrating plate deformation of Example 4.
Figure 20:
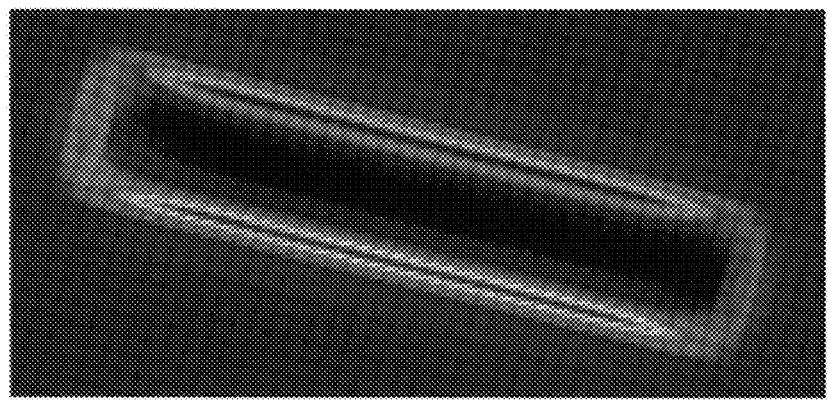
FIG. 20 is a diagram showing model calculation results of the maximum principal stress of vibrating plate deformation of Example 4.
Figure 21:
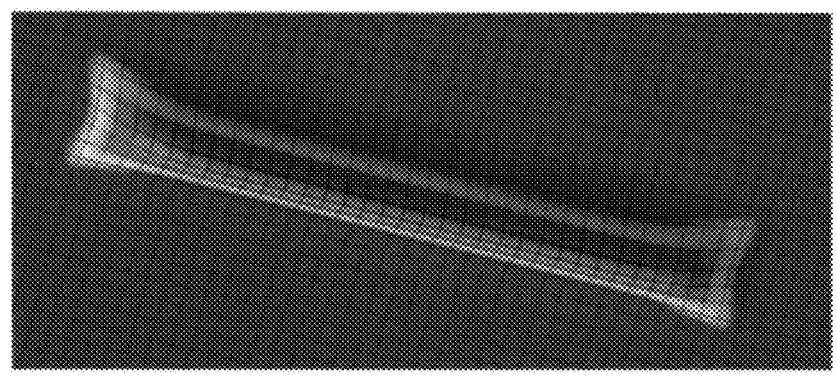
FIG. 21 is a diagram showing model calculation results of the minimum principal stress of vibrating plate deformation of Example 4.

A model calculation of the von Mises stress, the maximum principal stress, and minimum principal stress was carried out in the same manner as in Example 1 except that the CAV configuration of the substrate 11 was formed in a rectangular shape (the ratio of the lengths in the X direction and the Y direction was 1:5). FIG. 19 is a diagram showing the model calculation result of the von Mises stress of the vibrating plate deformation of Example 4, FIG. 20 is a diagram showing the model calculation result of the maximum principal stress of the vibrating plate deformation of Example 4, and FIG. 21 is a diagram showing a model calculation result of the minimum principal stress of the vibrating plate deformation of Example 4. As shown in the diagrams, the region where the maximum principal stress is large is blue, and the region where the minimum principal stress is large is red. That is, when the transmitting piezoelectric element is arranged in the blue region and the receiving piezoelectric element is arranged in the red region, it is possible to obtain the same effect as in the first embodiment.

OTHER EMBODIMENTS

Although omitted in the above embodiment, for example, a configuration is possible in which the side opposite to the piezoelectric element of the vibrating plate is a passage region for ultrasonic waves transmitted to the object to be measured or ultrasonic waves (echo signals) reflected from the object to be measured. According to this, it is possible to simplify the configuration of the vibrating plate on the side opposite to the piezoelectric element, and to ensure a good passage region for ultrasonic waves or the like. In addition, keeping the electrical regions such as the electrodes and the wiring and the adhesive fixing region of each member away from the object to be measured makes it easy to prevent contamination and leakage current between the electrical regions and the adhesive fixing regions and the object to be measured. Accordingly, it is also possible to suitably apply the invention to medical equipment which is particularly sensitive to contamination and leakage current, for example, an ultrasonic diagnostic apparatus (ultrasonic imaging apparatus), a sphygmomanometer, or a tonometer.

In addition, it is also preferable to bond a sealing plate for sealing the region including the piezoelectric element to the substrate. According to this, it is possible to physically protect the piezoelectric element, and the strength of the ultrasonic sensor also increases, thus, it is possible to enhance the structural stability. Furthermore, in a case where the piezoelectric element is formed as a thin film, it is also possible to improve the handling property of the ultrasonic sensor including the piezoelectric element.

In addition, in the embodiment described above, an example in which the opening is formed for each piezoelectric element is shown; however, the invention is not limited thereto, and the opening may be formed corresponding to the plurality of piezoelectric elements. For example, an opening common to the rows of piezoelectric elements lined up in the scanning direction (X direction) may be provided, or one opening may be provided throughout. In a case where such an opening is provided in common to a plurality of piezoelectric elements, the vibration states of the piezoelectric elements become different; however, the vibration may be carried out in the same manner as in a case where independent openings are provided, by providing pressing members or the like between each of the piezoelectric elements from the side opposite to the substrate of the vibrating plate.

In the embodiment described above, an example was given of a piezoelectric actuator formed of a CAV structure formed by ICP etching; however, the illustrated structure is not necessarily necessary as long as the piezoelectric element uses deflection deformation (extension deformation and compressive deformation). Example structures include a structure in which a CAV structure is manufactured by wet etching, a structure in which a CAV pattern is formed with a photoresist, a structure in which a vibrating plate and a CAV pattern are formed separately and bonded, and a structure in which a vibrating plate is formed as a cantilever.

It is possible to use the ultrasonic sensor of the invention as various pressure sensors. For example, in a liquid ejecting apparatus such as a printer, application is also possible as a sensor for detecting ink pressure or nozzle clogging. In addition, it is possible to suitably apply the configuration of the ultrasonic sensor of the invention to an ultrasonic motor, a piezoelectric transformer, a vibrating dust removing apparatus, a pressure electric transducer, an ultrasonic transmitter, an acceleration sensor, and the like. A finished body obtained by using a configuration of this type of ultrasonic sensor, for example, a robot on which the ultrasonic sensor described above is mounted, is also included in the ultrasonic device.

Figure 22:
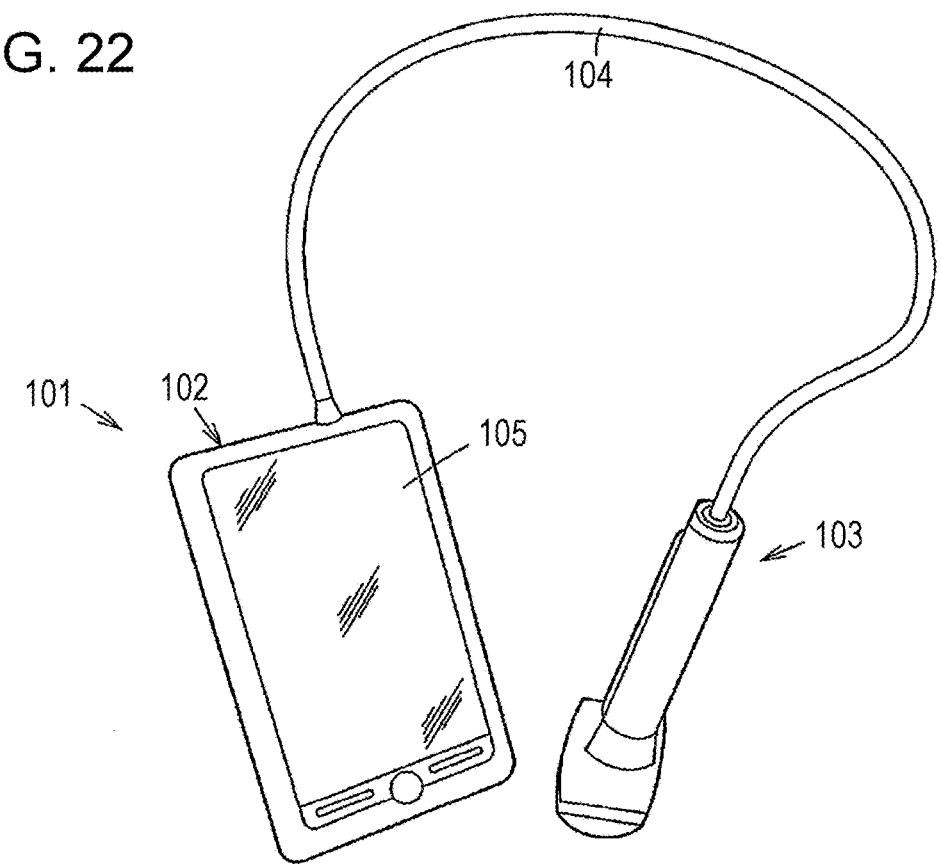
FIG. 22 is a perspective view showing an example of an ultrasonic imaging apparatus.
Figure 23:
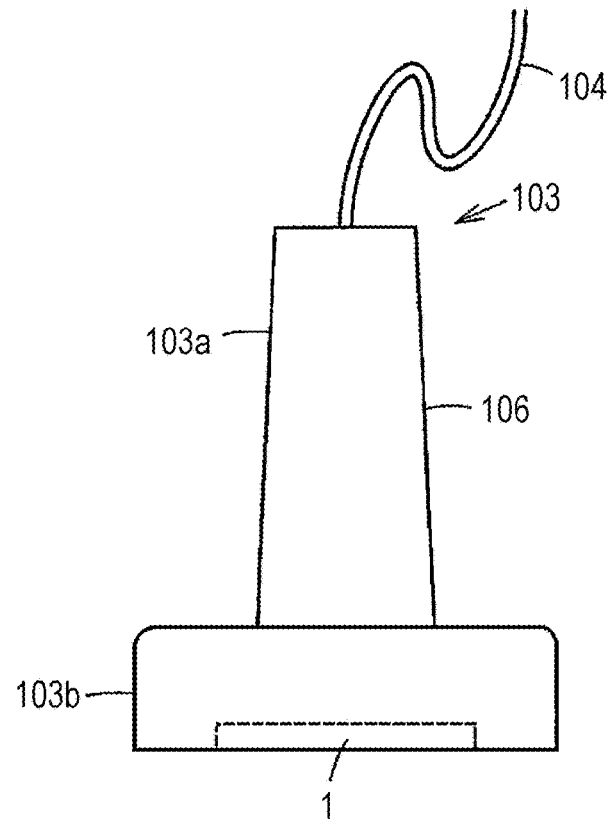
FIG. 23 is a front view showing an example of an ultrasonic probe.

Here, description will be given of an example of an electronic device using the above-described ultrasonic sensor. In the present embodiment, description will be given of an ultrasonic imaging apparatus as an example of an electronic device, and description will be given of an ultrasonic probe as an example of an ultrasonic device. FIG. 22 is a perspective view showing an example of an ultrasonic imaging apparatus. FIG. 23 is a plan view showing an example of the ultrasonic probe.

As shown in FIG. 22, the ultrasonic imaging apparatus 101 is provided with an apparatus terminal 102 and an ultrasonic probe (probe) 103. The apparatus terminal 102 and the probe 103 are connected by a cable 104. The apparatus terminal 102 and the probe 103 exchange electrical signals through the cable 104. A display device (display panel) 105 is incorporated in the apparatus terminal 102. The screen of the display panel 105 is exposed on the surface of the apparatus terminal 102. In the apparatus terminal 102, an image is generated based on detected ultrasonic waves transmitted from the ultrasonic sensor 1 (refer to FIG. 23) of the probe 103. The detection results are displayed on the screen of the display panel 105 as an image.

As shown in FIG. 23, the probe 103 has a housing 106. The housing 106 houses an ultrasonic sensor 1 in which a plurality of ultrasonic elements 10 (refer to FIG. 1 and the like) are two-dimensionally arranged in the X direction and the Y direction. The ultrasonic sensor 1 is provided such that the surface thereof is exposed on the surface of the housing 106. The ultrasonic sensor 1 outputs ultrasonic waves from the surface and receives reflected ultrasonic waves. In addition, it is possible to provide the probe 103 with a probe head 103*b* attachable and detachable from the probe main body 103*a*. At this time, it is possible to incorporate the ultrasonic sensor 1 in the housing 106 of the probe head 103*b*.

What is claimed is:

1. A piezoelectric sensor comprising:
   a substrate having openings which are open in a thickness direction;
   a vibrating plate which blocks the opening;
   a transmitting piezoelectric element for transmission; and
   a receiving piezoelectric element for reception,
   wherein the transmitting piezoelectric element and the receiving piezoelectric element are arranged on the vibrating plate opposed to each one of the openings, and,
   when an external force is applied in a vertical direction with respect to the vibrating plate opposed to the opening, a region which has a maximum principal stress which is a maximum value of the stress of the vibrating plate is a first region, and a region which has a minimum principal stress which is a minimum value of the stress of the vibrating plate is a second region, the receiving piezoelectric element is arranged in the first region and the transmitting piezoelectric element is arranged in the second region.

2. The piezoelectric sensor according to claim 1,
   wherein the first region is a region opposed to a peripheral edge of the vibrating plate opposed to the opening, and the second region is a center portion of the vibrating plate opposed to the opening.

3. The piezoelectric sensor according to claim 2,
   wherein the receiving piezoelectric element is formed of a first receiving piezoelectric element and a second receiving piezoelectric element,
   the first receiving piezoelectric element and the second receiving piezoelectric element are each arranged in a region opposed in a first direction or a second direction to the peripheral edge of the vibrating plate opposed to the opening,
   the transmitting piezoelectric element is arranged between the first receiving piezoelectric element and the second receiving piezoelectric element so as to be spaced apart and not in contact with each other.

4. The piezoelectric sensor according to claim 1,
   wherein an area occupied by the transmitting piezoelectric element on the vibrating plate opposed to the one opening is larger than an area occupied by the receiving piezoelectric element.

5. The piezoelectric sensor according to claim 1,
   wherein a material of a first piezoelectric layer forming the transmitting piezoelectric element and a material of a second piezoelectric layer forming the receiving piezoelectric element are different from each other.

6. The piezoelectric sensor according to claim 1, wherein a thickness of the first piezoelectric layer forming the transmitting piezoelectric element is thinner than a thickness of the second piezoelectric layer forming the receiving piezoelectric element.

7. A piezoelectric device comprising:
the piezoelectric sensor according to claim 1.

8. A piezoelectric device comprising:
the piezoelectric sensor according to claim 2.

9. A piezoelectric device comprising:
the piezoelectric sensor according to claim 3.

10. A piezoelectric device comprising:
the piezoelectric sensor according to claim 4.

11. A piezoelectric device comprising:
the piezoelectric sensor according to claim 5.

12. A piezoelectric device comprising:
the piezoelectric sensor according to claim 6.

* * * * *